(12) United States Patent
Watanabe et al.

(10) Patent No.: US 8,092,139 B2
(45) Date of Patent: Jan. 10, 2012

(54) INLINE-TYPE WAFER CONVEYANCE DEVICE

(75) Inventors: Naoki Watanabe, Kawasaki (JP); Einstein Noel Abarra, Hachioji (JP); David Djulianto Djayaprawira, Inagi (JP); Yasumi Kurematsu, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 59 days.

(21) Appl. No.: 12/728,588

(22) Filed: Mar. 22, 2010

(65) Prior Publication Data

US 2010/0239394 A1 Sep. 23, 2010

Related U.S. Application Data

(63) Continuation of application No. PCT/JP2007/071816, filed on Nov. 9, 2007.

(51) Int. Cl.
*H01L 21/677* (2006.01)

(52) U.S. Cl. .......................................... 414/217; 414/939

(58) Field of Classification Search .................. 414/939, 414/217
See application file for complete search history.

(56) References Cited

U.S. PATENT DOCUMENTS

| 4,917,556 A | 4/1990 | Stark et al. ................ 414/217 |
| 5,658,114 A * | 8/1997 | Mahler ........................ 414/217 |
| 5,695,564 A | 12/1997 | Imahashi ..................... 118/719 |
| 6,679,671 B2 * | 1/2004 | Blonigan et al. .............. 414/217 |
| 7,090,741 B2 | 8/2006 | Narushima et al. ...... 156/345.26 |
| 7,210,246 B2 | 5/2007 | van der Meulen ............. 34/467 |
| 8,016,537 B2 * | 9/2011 | Watanabe et al. ............. 414/217 |
| 2004/0049308 A1 * | 3/2004 | Evers et al. .................... 700/121 |
| 2005/0005847 A1 | 1/2005 | Hiroki ........................ 118/719 |
| 2005/0006230 A1 | 1/2005 | Narushima et al. ......... 204/298.2 |
| 2006/0102078 A1 | 5/2006 | Fairbairn et al. ............. 118/719 |
| 2009/0134010 A1 | 5/2009 | Shibamoto et al. ........ 204/192.1 |

FOREIGN PATENT DOCUMENTS

| JP | 1-500072 | 1/1989 |
| JP | 3-062944 | 3/1991 |
| JP | 5-304197 | 11/1993 |
| JP | 7-099224 | 4/1995 |
| JP | 7-230942 | 8/1995 |
| JP | 8-111449 | 4/1996 |
| JP | 2003-077976 | 3/2003 |
| JP | 2003-203963 | 7/2003 |

* cited by examiner

*Primary Examiner* — Joshua Rudawitz

(74) *Attorney, Agent, or Firm* — Fitzpatrick, Cella, Harper & Scinto

(57) ABSTRACT

There are comprised a load chamber (51) for carrying in a wafer from outside, an unload chamber (53) for carrying out a wafer to outside, and a plurality of conveyance chambers (54a, 54b, 54c) and a plurality of process modules (52a, 52b) connected in series between the load chamber and the unload chamber. The conveyance chambers and the process modules are connected alternately and the plurality of conveyance chambers includes a first end conveyance chamber (54a) connected to the load chamber, a second end conveyance chamber (54c) connected to the unload chamber, and another one or a plurality of intermediate conveyance chambers (54b).

2 Claims, 25 Drawing Sheets

PRIOR ART

INLINE-TYPE WAFER CONVEYANCE DEVICE

CROSS-REFERENCES TO RELATED APPLICATIONS

This application is a continuation application of International application No. PCT/JP2007/071816, filed on Nov. 9, 2007, the entire contents of which are incorporated by reference herein.

TECHNICAL FIELD

The present invention relates to a semiconductor manufacturing device and a manufacturing method and, in more detail, relates to an inline-type wafer conveyance device having a compact structure.

BACKGROUND ART

There are several types of conventional semiconductor wafer conveyance devices and each of them has a big drawback. A conventional cluster-type wafer conveyance device has a structure in which a plurality of process modules is arranged radially around a robot chamber located in the center. Such a cluster-type wafer conveyance device requires a large footprint for installation. Further, each time processing in each process module is completed, a wafer is temporarily placed in a buffer part etc. and waits for the next processing, and therefore, the processing speed of the device as a whole is relatively slow. Further, in most cases, the maximum number of process modules in a cluster-type wafer conveyance device is normally limited to five or six for design reasons.

An inline-type wafer conveyance device has a higher processing speed compared to that of a cluster-type device. However, because of its rectilinear structure, it is hard to adapt the inline-type wafer conveyance device to the structure of a state of the art semiconductor manufacturing facility. Further, in a conventional inline-type wafer conveyance device, when a wafer is conveyed in a vacuum environment in a semiconductor manufacturing process, there may be a case where particles are generated at an unacceptable level due to the friction between the components of the wafer conveyance device.

A plan view of a conventional inline-type wafer conveyance device is shown in FIG. 1 (for example, refer to patent document 1). In a wafer conveyance device 10, each of process modules 13a to 13g is arranged adjacent to each other and connected in an inline manner. Each process module is separated by a gate valve (not shown schematically). A wafer is conveyed from a load chamber 14 to the first process module 13a by a robot 12 within a robot chamber 11 and is processed sequentially in each process module. The processed wafer is conveyed from the last process module 13g to an unload chamber 15 by the robot 12. Extra robots to convey a wafer or robot chambers are not necessary, and therefore, the footprint required in the wafer conveyance device 10 is comparatively small.

A partial section view of the inline-type wafer conveyance device 10 shown in FIG. 1 is shown in FIG. 2. A wafer 21 is mounted on a carrier 23 and conveyed from a certain process module to the next process module. In each process module, the wafer 21 is lifted from the carrier 23 by a lift base 26 and processed, and then is mounted on the carrier 23 again and conveyed to the next process module. The carrier 23 is moved by means of a transfer mechanism, such as a roller 25. When the wafer 21 is conveyed to the next neighboring process module, a gate valve 24 is opened and thus the neighboring process modules are brought into a state where they are not hermetically sealed from each other. The wafer 21 having been subjected to processing in a certain process module waits until the next process module becomes empty.

A plan view of another conventional inline-type wafer conveyance device 30 is shown in FIG. 3 (for example, refer to patent document 2). The wafer conveyance device 30 comprises two front opening unified pods (FOUP) 31a and 31b. For example, the FOUP 31a has two load chambers 32a and 32b each having a cassette for storing an unprocessed wafer and the FOUP 31b has two unload chambers 33a and 33b each having a cassette for storing processed wafers. The wafer conveyance device 30 further comprises buffer chambers 36a to 36d for temporarily holding a wafer during its conveyance. At the time of processing, a wafer is conveyed from a cassette within the load chamber 32a or 32b to the first buffer chamber 36a by a robot 35a within a robot chamber 34a. As shown schematically, the wafer conveyance device 30 comprises robot chambers 38a to 38c between the buffer chambers. Between each buffer chamber and its neighboring robot chamber, and between each robot chamber and its neighboring process module, a gate valve 39 is provided as shown schematically. A wafer once placed in the buffer chamber 36a is conveyed to a first process module 37a by a robot within the robot chamber 38a and processed therein. Subsequently, the wafer is conveyed to a second process module 37b again by the robot within the robot chamber 38a and processed therein. The wafer having been subjected to the processing in the second process module 37b is placed in the second buffer chamber 36b by the robot within the robot chamber 38a. Further, the wafer is conveyed from the buffer chamber 36b to a third process module 37c by the robot within the second robot chamber 38b. After that, the wafer is similarly moved from the process module 37c to a process module 37f sequentially and processed therein. The wafer having been subjected to the processing in all of the process modules is once placed in the buffer chamber 36d and then stored in the cassette within the unload chamber 33a or 33b of the FOUP 31b by a robot 35b within a robot chamber 34b. The wafer conveyance device 30 has an advantage that the number of the process modules can be increased flexibly as needed.

A plan view of a conventional cluster-type wafer conveyance device is shown in FIG. 4 (for example, refer to patent document 3). A wafer conveyance device 40 comprises an inlet module 45a and an outlet module 45b through which a wafer 46 is carried in from and carried out to outside, conveyance chambers 42a and 42b for conveying a wafer to process modules 41b, 41c, 41f and 41g, and conveyance robots 43a and 43b provided within the conveyance chambers 42a and 42b. A main controller 47 communicates with each process module controller P, the inlet module 45a and the outlet module 45b, and an operator control panel via a standard communication bus 48. The wafer 46 not processed yet within the inlet module 45a is once placed on an aligner 44 by the conveyance robot 43a within the conveyance chamber 42a and its orientation is adjusted on the aligner 44. Then, the wafer on the aligner 44 is transferred to, for example, the process module 41b or 41c by the conveyance robot 43a or 43b and processed therein, and then returned onto the aligner 44 again. After such a task is repeated, the wafer having been subjected to the processing in the process modules 41b, 41c, 41f and 41g is returned to the outlet module 45b by the conveyance robot 43a.

[Patent document 1] U.S. patent application Publication No. 2006/0102078 Specification
[Patent document 2] U.S. Pat. No. 7,210,246 Specification
[Patent document 3] Japanese Publication of patent application No. HEI 1-500072

SUMMARY OF THE INVENTION

It is required, however, for the inline-type wafer conveyance device 10 shown in FIG. 1 and FIG. 2 to comprise the mobile carrier 23 capable of holding a wafer to be processed within the wafer conveyance device 10 and a transfer mechanism, such as the roller 25, for moving the carrier 23. In this case, a problem arises that the structure of the wafer conveyance device 10 becomes complicated and expensive. Further, the carrier 23 is moved on a transfer mechanism, such as the roller 25, such that particles are likely to be generated due to friction between these components. If generated particles stick to the wafer 21 conveyed within the wafer conveyance device 10, the quality of a film to be formed on the wafer will be degraded.

The conventional inline-type wafer conveyance device 30 shown in FIG. 3 requires the buffer chambers 36a to 36d for temporarily placing a wafer, increasing the degree of complication of the device. Further, the footprint required by the wafer conveyance device 30 becomes larger due to these buffer chambers. Furthermore, if an attempt is made to realize the wafer conveyance device 30 without using the buffer chambers 36a to 36d, it becomes necessary to directly deliver, for example, a wafer having been subjected to the processing in the second process module 37b from the robot chamber 38a to the next robot chamber 38b. That is, a wafer transfer between robots is necessary. This direct transfer degrades the precision and reliability of the operation of the wafer conveyance device 30.

The conventional cluster-type wafer conveyance device 40 has a structure in which the process modules are arranged radially with the conveyance chambers 42a and 42b located in the center as a center, and therefore, a problem arises that its footprint is large. Further, with the cluster-type wafer conveyance device 40, it is necessary to once place a wafer on the aligner 44 before conveying the wafer to each process module. The necessity of such an aligner causes the footprint of the whole device to further increase. Then, each time processing is completed, the wafer needs to be placed on the aligner 44, and therefore, a complicated conveying task is required.

In order to solve the conventional problems described above, an object of the present invention is to realize an inline-type wafer conveyance device capable of suppressing the generation of particles, obviating a complicated conveyance mechanism, and having a simple configuration with a small footprint.

In order to achieve the above-mentioned object, an inline-type wafer conveyance device of the present invention comprises a load chamber for carrying in a wafer from outside, an unload chamber for carrying out a wafer to outside, and a plurality of conveyance chambers and a plurality of process modules connected in series between the load chamber and the unload chamber. The conveyance chambers and the process modules are connected alternately and the plurality of the conveyance chambers includes a first end conveyance chamber connected to the load chamber, a second end conveyance chamber connected to the unload chamber, and another one or a plurality of intermediate conveyance chambers.

The first end conveyance chamber is configured to convey a wafer from the load chamber to the first process module, the intermediate conveyance chambers each to transfer the wafer between process modules located ahead and behind, and the second end conveyance chamber to convey the wafer from the last process module to the unload chamber.

In the above-described structure, it may also be possible to arrange the load chamber, the first end conveyance chamber, the respective process modules, the respective intermediate conveyance chambers, the second end conveyance chamber and the unload chamber connected in series so that they form a U-shape as a whole.

It may also be possible to further provide at least one process module to be connected to at least one of the first end conveyance chamber, the intermediate conveyance chambers and the second end conveyance chamber constituting the U-shaped arrangement in the inner region of the U-shaped arrangement.

It may also be possible for one of the process modules to have substantially a square plane shape and for any two side surfaces perpendicular to each other of the four side surfaces to be connected to the two conveyance chambers neighboring the process module. In this case, the whole structure of the wafer conveyance device is not rectilinear but bends at right angles at the process module. Further, it may also be possible to configure so that one of the conveyance chambers connected to the process module has substantially a square plane shape and the side surface perpendicular to the side surface connected to the process module is connected to the other process module neighboring the conveyance chamber. For this case also, the whole structure of the wafer conveyance device bends at right angles at the conveyance chamber.

The plane shape of the process module and the conveyance chamber is not limited to a square. A circular shape or other various plane shapes can be taken. The structure is designed so that one of the process modules is connected to two conveyance chambers neighboring via two gate valves, respectively, and the directions of the two gate valves are perpendicular to each other. Then, the structure is designed so that one of the two conveyance chambers is connected to the one process module and the other process module via two gate valves, and the directions of the two gate valves are perpendicular to each other.

It may also be possible to further provide one intermediate conveyance chamber neighboring to one of the intermediate conveyance chambers and to design the structure so that the two neighboring intermediate conveyance chambers each have a square plane shape, are connected to each other via one of two side surfaces perpendicular to each other, and are connected to the neighboring process module via the other side surface.

In this structure also, the plane shape of the intermediate conveyance chamber is not limited to a square. A circular plane shape and other various plane shapes can be taken. There is further provided an intermediate conveyance chamber neighboring to one of the intermediate conveyance chambers and these two respective intermediate conveyance chambers are each connected to each other via a gate valve. Further, these two intermediate conveyance chambers are connected to different process modules via another gate valve the direction of which is perpendicular to the gate valve, respectively.

In order to make it possible to simultaneously process two wafers, it may also be possible to separately configure each process module as a first process module and a second process module capable of independent processing. Here, the first process module and the second process module have two neighboring side surfaces, respectively, and one of the side surfaces of the first process module is connected to one of the side surfaces of the conveyance chamber located ahead via a gate valve and the other side surface is connected to one of the side surfaces of the conveyance chamber located behind via a gate valve. One of the side surfaces of the second process module is connected to the other side surface of the conveyance chamber located ahead via a gate valve and the other side surface is connected to the other side surface of the conveyance chamber located behind via a gate valve.

It is possible to design the structure so that the above-mentioned first and second process modules have various plane shapes, such as substantially a square and a circle. The first process module and the second process module are connected to the conveyance chamber located ahead via one of two gate valves the directions of which are perpendicular to each other, and connected to the conveyance chamber located behind via the other gate valve, respectively.

In order to realize an inline-type wafer conveyance device having a bent structure instead of a rectilinear one, it is possible to use a buffer chamber instead of at least one process module. The buffer chamber is configured so that two side surfaces in opposition to each other are connected to the conveyance chambers located ahead and behind via gate valves.

In order to realize a U-shaped structure, it may also be possible to provide an extended conveyance chamber instead of one process module. The extended conveyance chamber includes a conveyance mechanism located substantially in the center part and two buffer parts located on both sides thereof.

According to the present invention, there is realized an inline-type wafer conveyance device capable of suppressing generation of particles, obviating a complicated conveyance mechanism, and having a small footprint.

Figure 1:
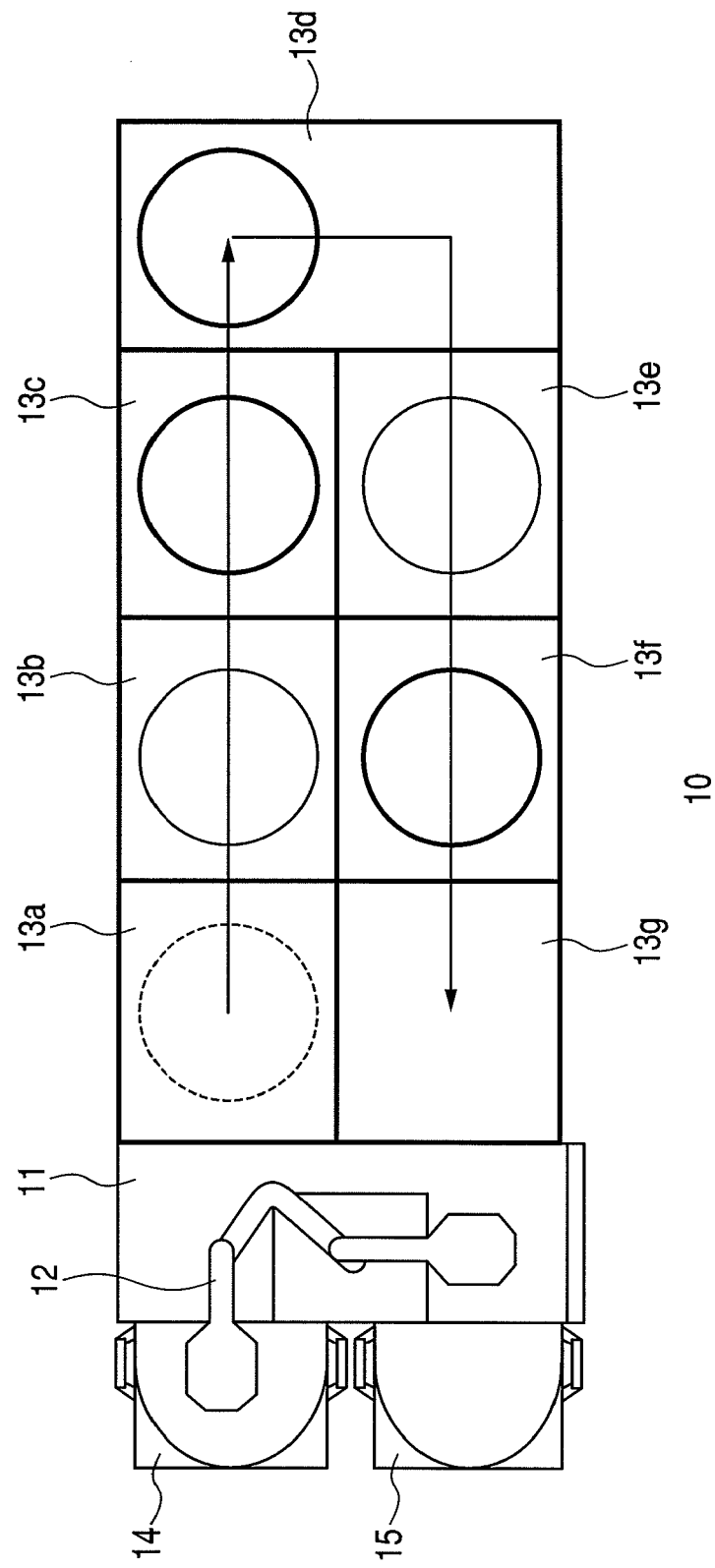
FIG. 1 is a plan view of a conventional inline-type wafer conveyance device.

REFERENCE SIGNS LIST 10 wafer conveyance device
11 conveyance chamber
12 robot
13a-13g process module
14 load chamber
15 unload chamber
21 wafer
23 carrier
24 gate valve
25 roller
26 lift base
30 wafer conveyance device
31a, 31b FOUP
32a, 32b load chamber
33a, 33b process module
34a, 34b conveyance chamber
35a, 35b robot
36a-36d buffer chamber
37a-37f process module
38a-38c conveyance chamber
39 gate valve
40 wafer conveyance device
41b, 41c, 41f, 41g process module
42a, 42b conveyance chamber
43a, 43b conveyance robot
44 aligner
45a inlet module
45b outlet module
46 wafer
47 main controller
48 standard communication bus
50 wafer conveyance device
51 load chamber 52a, 52b process module
53 unload chamber
54a-54c conveyance chamber
55a-55c conveyance mechanism
56a-56f gate valve
60 wafer conveyance device
61 load chamber
63 unload chamber
136, 137 clean room
152e process module
158 buffer chamber
168a, 168b buffer chamber
164d extended conveyance chamber
165d conveyance mechanism
168c, 168d buffer part
170, 180, 190, 200, 210, 220, 230, 240, 250 wafer conveyance device
171, 181, 191, 201, 211, 221, 231, 241, 251 load chamber
172a-172d, 182a-182f, 192a-192f, 202a-202j, 212a-212j, 222a-222j, 232a-232j, 242a-242j, 252a-252h process module
173, 183, 193, 203, 213, 223, 233, 243, 253 unload chamber
174a end conveyance chamber
175a wafer holding means

BEST MODES FOR CARRYING OUT THE INVENTION

Figure 5:
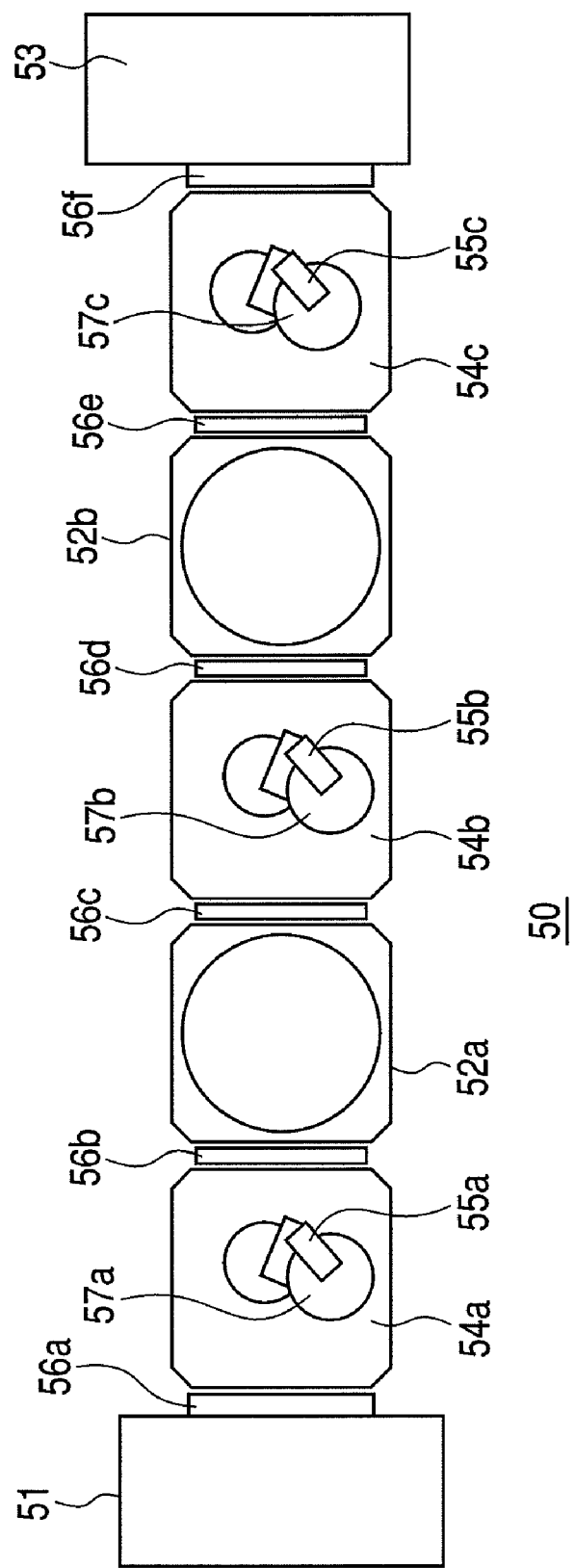
FIG. 5 is a plan view of an inline-type wafer conveyance device according to the present invention.

A plan view of an inline-type wafer conveyance device of the present invention is shown in FIG. 5. A wafer conveyance device 50 has a structure in which a load chamber 51 for carrying in an unprocessed wafer from outside, a first end conveyance chamber 54a having a conveyance mechanism 55a, a first process module 52a, an intermediate conveyance chamber 54b having a conveyance mechanism 55b, a second process module 52b, a second end conveyance chamber 54c having a conveyance mechanism 55c, and an unload chamber 53 for carrying out a processed wafer to outside are connected in series. The first end conveyance chamber 54a is provided between the load chamber 51 and the first process module 52a, the intermediate conveyance chamber 54b is provided between the first process module 52a and the second process module 52b, and the second end conveyance chamber 54c is provided between the second module 52b and the unload chamber 53. The conveyance mechanisms 55a to 55c are each configured as, for example, a robot having an arm to move a wafer. The load chamber 51 may have a plurality of load chambers (not shown schematically) and the unload chamber 53 may have a plurality of unload chambers (not shown schematically).

An unprocessed wafer carried in from outside is stored within the load chamber 51. The conveyance mechanism 55a conveys an unprocessed wafer 57a from the load chamber 51 to the first process module 52a. The conveyance mechanism 55b conveys a wafer 57b having been subjected to the processing in the first process module 52a to the second process module 52b. The conveyance mechanism 55c conveys a wafer 57c having been subjected to the processing in the second process module 52b to the unload chamber 53.

It may also be possible to provide gate valves 56a to 56f between the load chamber 51 and the first end conveyance chamber 54a, between the first end conveyance chamber 54a and the first process module 52a, between the first process module 52a and the intermediate conveyance chamber 54b, between the intermediate conveyance chamber 54b and the second process module 52b, between the second process module 52b and the second end conveyance chamber 54c, and between the second end conveyance chamber 54c and the unload chamber 53, respectively, as shown in FIG. 5.

The wafer conveyance device 50 shown in FIG. 5 comprises the two process modules 52a and 52b and the three conveyance chambers 54a, 54b and 54c, however, the structure of the wafer conveyance device in the present embodiment is not limited to this. It is possible to flexibly embody the wafer conveyance device in the present embodiment by arranging in series a necessary number of intermediate conveyance chambers and process modules between the first end conveyance chamber 54a and the second end conveyance chamber 54b in accordance with a desired number of processes when more processes need to be performed on a wafer. That is, it is possible to configure the wafer conveyance device 50 so as to have a structure in which a plurality of conveyance chambers and a plurality of process modules are connected in series between the load chamber 51 and the unload chamber 53 via gate valves. The conveyance chambers and the process modules are connected alternately and to the load chamber 51 and the unload chamber 53, the first end conveyance chamber and the second end conveyance chamber are connected, respectively.

The load chamber 51 stores an unprocessed wafer carried into the wafer conveyance device 50 from outside (atmosphere side) and includes an evacuation mechanism (not shown schematically). The unload chamber 53 stores a processed wafer to be carried out to outside (atmosphere side) and includes an evacuation mechanism (not shown schematically).

An example of a process using the inline-type wafer conveyance device in the present embodiment shown in FIG. 5 will be described. First, an unprocessed wafer is carried into the load chamber 51 from outside (atmosphere side) and stored therein and the inside of the load chamber 51 is evacuated into a vacuum state using the evacuation mechanism (not shown schematically). Next, the gate valve 56a between the first end conveyance chamber 54a and the load chamber 51 and the gate valve 56b between the first end conveyance chamber 54a and the first process module 52a are opened. Next, the unprocessed wafer within the load chamber 51 is conveyed to the first process module 52a using the conveyance mechanism 55a within the first end conveyance chamber 54a. After the gate valves that have been opened are closed, the conveyed wafer is subjected to predetermined processing (for example, annealing) in the first process module.

Next, the gate valve 56c between the first process module 52a and the intermediate conveyance chamber 54b and the gate valve 56d between the intermediate conveyance chamber 54b and the second process module 52b are opened and the wafer having been subjected to the processing within the first process module 52a is conveyed to the second process module 52b using the conveyance mechanism 55b within the intermediate conveyance chamber 54b. After the gate valves that have been opened are closed, the wafer is subjected to predetermined processing (for example, sputter processing, etching processing, etc.) within the second process module 52b.

Next, the gate valve 56e between the second process module 52b and the second end conveyance chamber 55c and the gate valve 56f between the second end conveyance chamber 55c and the unload chamber 53 are opened and the wafer having been subjected to the processing in the second process module 52b is conveyed to the unload chamber 53 using the conveyance mechanism 55c within the second end conveyance chamber 54c and carried out to the outside of the wafer conveyance device 50. In order to obtain high throughput, it is necessary to make the processing time in each process module substantially same. When the tact time required to process one wafer throughout the entire wafer conveyance device 50 is 36 seconds, the throughput of the wafer conveyance device 50 is 100 pph and 100 wafers can be processed in one hour. When the tact time is 12 seconds, the throughput is 300 pph and 300 wafers can be processed in one hour.

Figure 2:
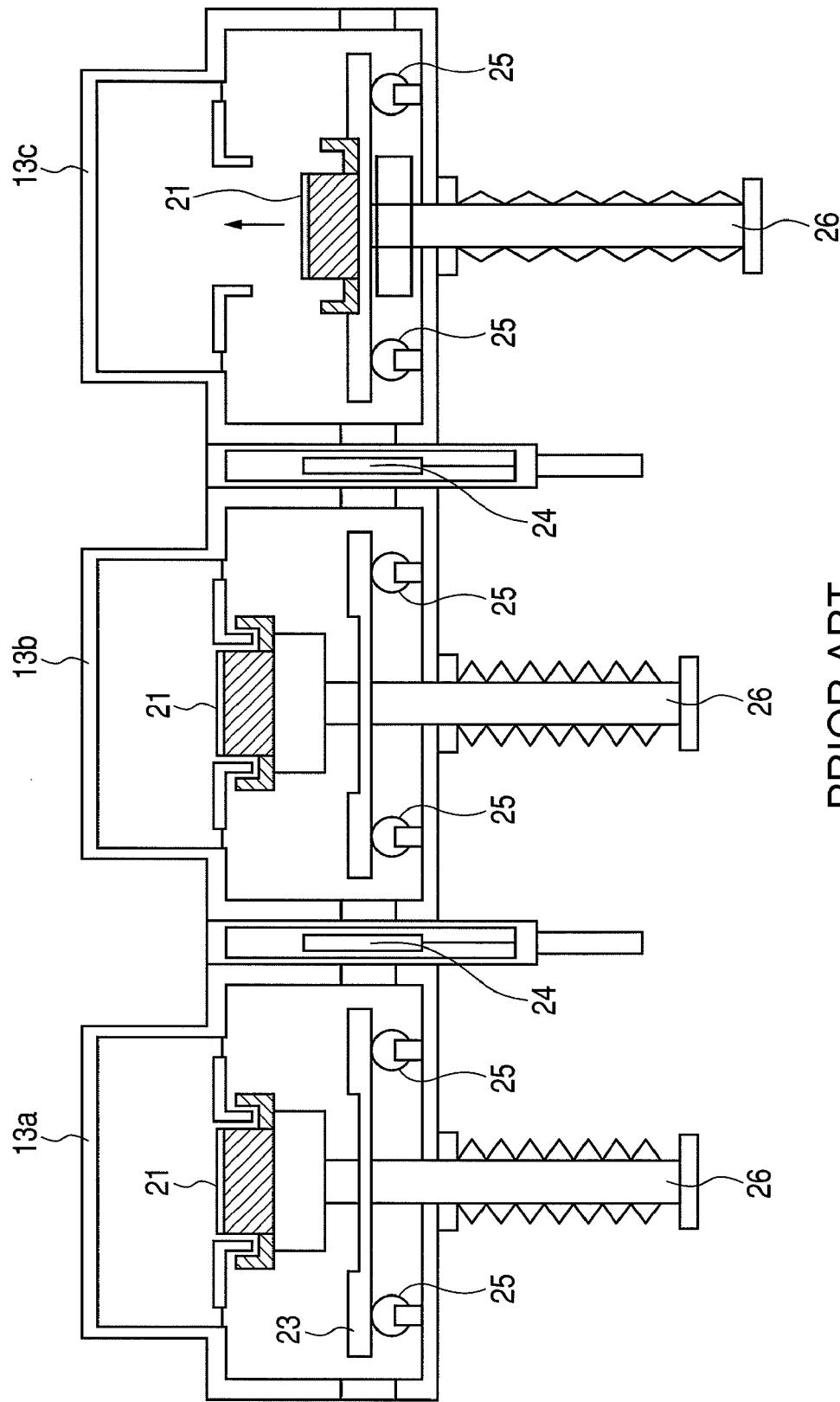
FIG. 2 is a partial section view of the conventional inline-type wafer conveyance device shown in FIG. 1.
Figure 3:
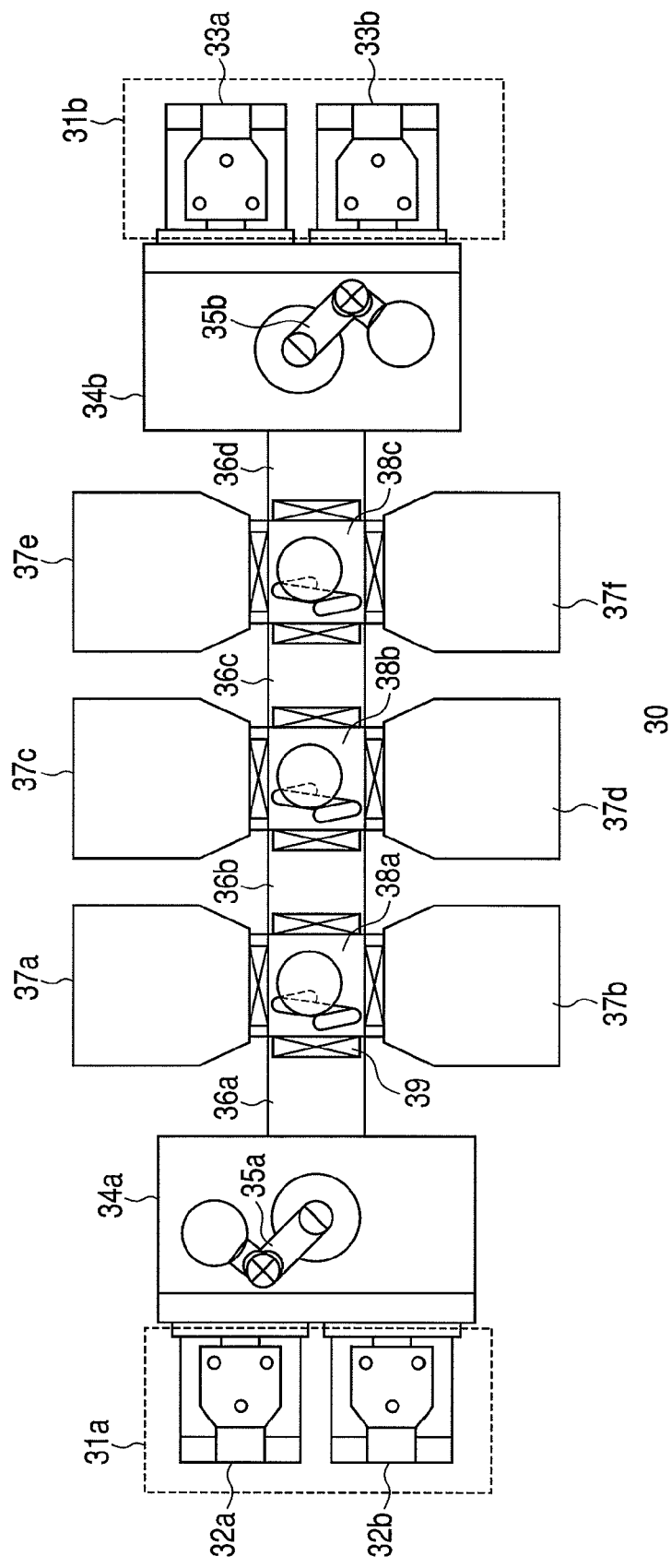
FIG. 3 is a plan view of another conventional inline-type wafer conveyance device.
Figure 4:
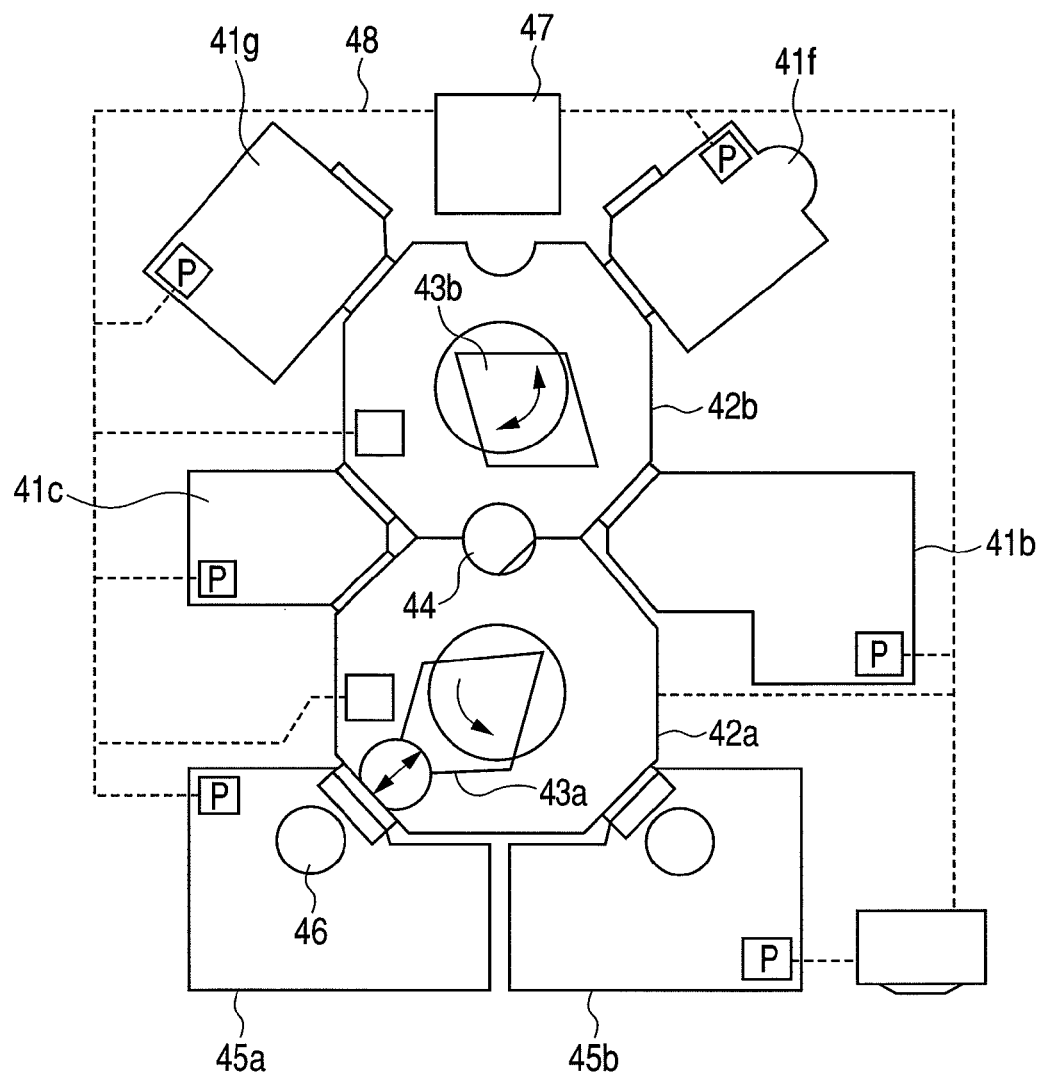
FIG. 4 is a plan view of a conventional cluster-type wafer conveyance device.

The wafer conveyance device 50 in the present embodiment does not require a transfer mechanism, such as the carrier 23 and the roller 25 shown in FIG. 2. Because of this, particles are unlikely to be generated during the period of conveyance of a wafer. Further, the wafer conveyance device 50 has a simpler structure and a smaller footprint compared to a conveyance device that uses a buffer chamber as shown in FIG. 3. Further, with such a simple structure, it is possible to realize a wafer conveyance device having high reliability. In addition, the wafer conveyance device 50 has a very simple structure and a small footprint compared to the cluster-type wafer conveyance device as shown in FIG. 4. As described above, according to the present embodiment, it is possible to comprehensively solve the problems of the prior art described above. Further, a wafer is conveyed in one direction from the load chamber 51 to the unload chamber 53 within the wafer conveyance device 50. Because of this, it is possible to convey a wafer having been subjected to processing in a certain process module to the next process module and carry the subsequent wafer into the process module at the same time. Because of this, it is possible to improve the throughput of the whole device.

First Embodiment

Figure 6:
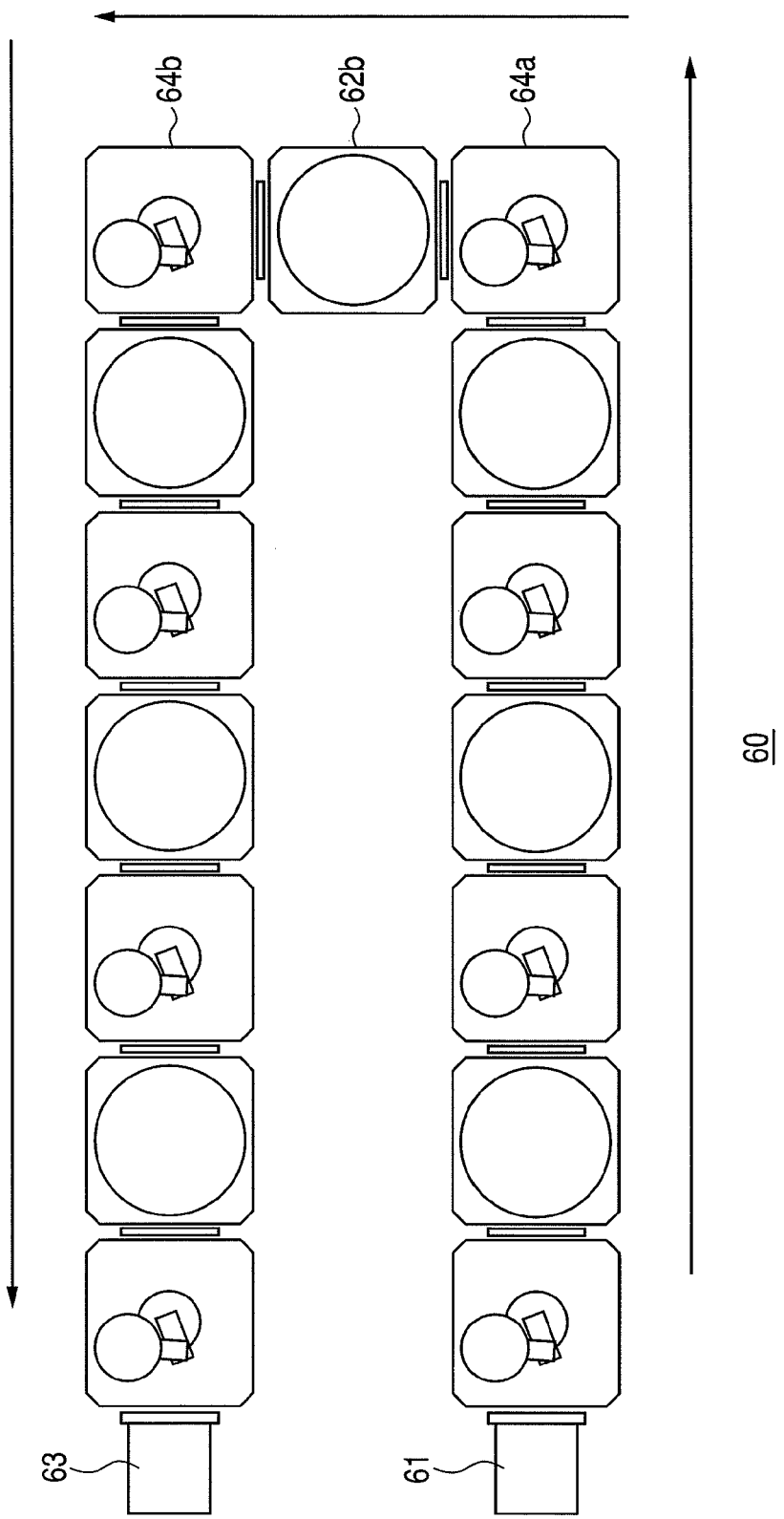
FIG. 6 is a plan view of another embodiment of the inline-type wafer conveyance device according to the present invention.

A plan view of another embodiment of the inline-type wafer conveyance device according to the present invention is shown in FIG. 6. A wafer conveyance device 60 has, for example, an inline-type structure in which a load chamber 61, eight conveyance chambers, seven process modules and an unload chamber 63 are arranged not in a rectilinear shape but in a deformed U-shape, as shown in FIG. 6. Arrows in the figure indicate the directions in which a wafer is conveyed. Two conveyance chambers 64a and 64b arranged along the way have, for example, substantially a square plane shape and are configured so that two neighboring side surfaces are coupled to gate valves, as shown schematically. The wafer conveyance device 60 realizes the U-shaped arrangement by the structure. It may also be possible to employ the load chamber 61 and the unload chamber 63 as shown in FIG. 6 instead of the load chamber 51 and the unload chamber 53 shown in FIG. 5. With the wafer conveyance device 50 in FIG. 5, the overall length of the device is increased accompanying an increase in a necessary number of processes and there is a possibility that it becomes difficult to install the device in a factory etc. In this case, if the structure in FIG. 6 is employed, it is possible to suppress the length of the device from increasing while making use of the characteristics of the present invention described above.

Second Embodiment

Figure 7:
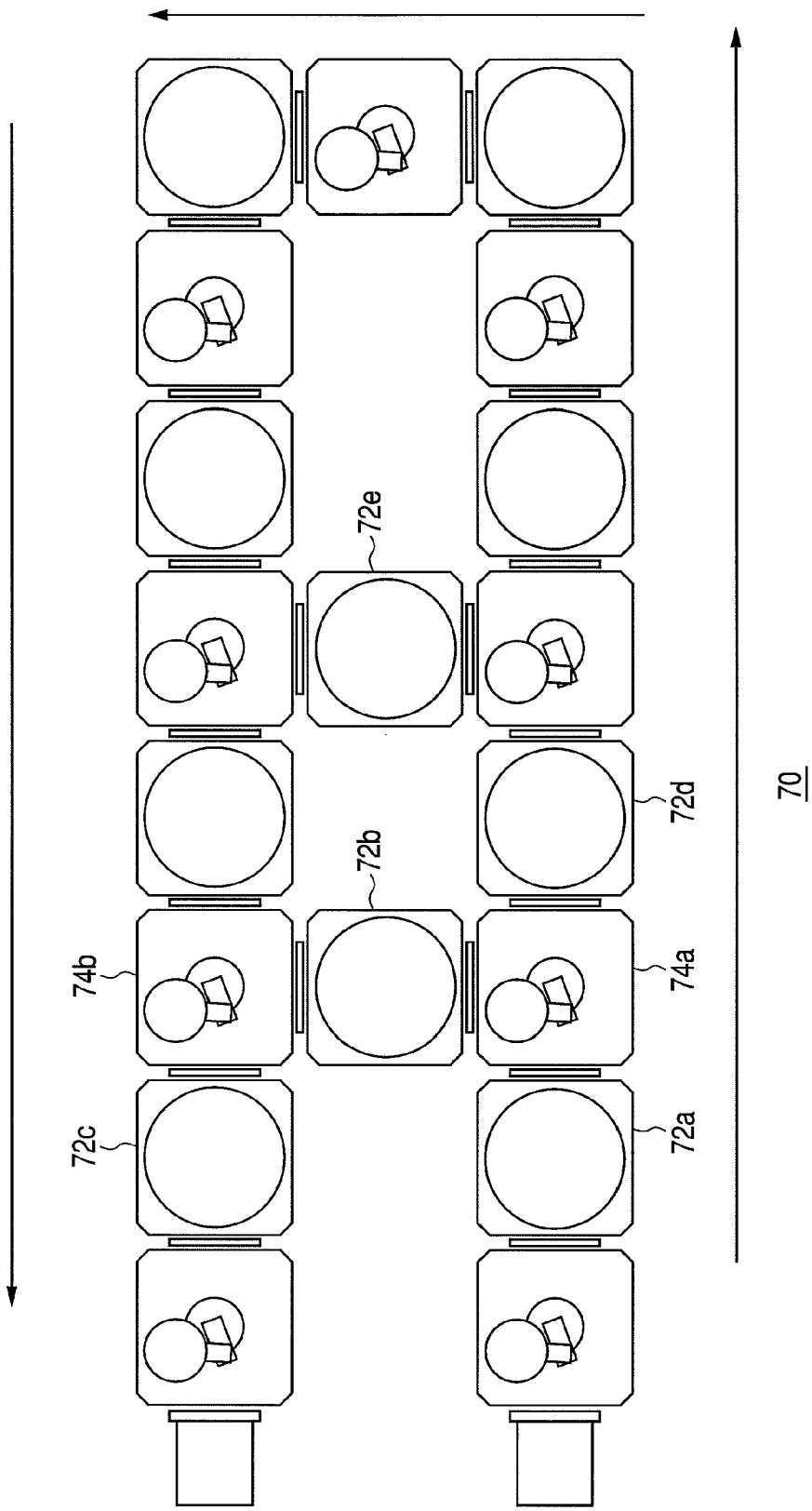
FIG. 7 is a plan view of another embodiment of the inline-type wafer conveyance device according to the present invention.

A plan view of another embodiment of the inline-type wafer conveyance device according to the present invention is shown in FIG. 7. A wafer conveyance device 70 comprises nine conveyance chambers and ten process modules. It is of course possible to employ a different number of components from the above. In the empty region inside the U-shaped arrangement shown in FIG. 6, at least one or more intermediate process modules 72b and 72e are comprised. The intermediate process modules 72b, 72d are connected to at least one conveyance chamber constituting the U-shaped arrangement, respectively. With this structure, it is made possible to process in a brief time a wafer that requires a small number of processes. For example, a wafer that requires processing only in three process modules 72a, 72b and 72c in FIG. 7 is conveyed to the process module 72b via a conveyance chamber 74a and processed therein after having been subjected to the processing in the process module 72a, and is further conveyed to the process module 72c via a conveyance chamber 74b and processed therein. Due to this, it is possible to flexibly select a conveyance path for each wafer that requires different processing, and to increase the processing speed as a whole. It is also possible to efficiently perform processing when stacking the same layer continuously on one and the same wafer. For example, when it is necessary to form two layers of aluminum continuously on one wafer, it is possible to form the first layer in the process module 72a and the second layer in the process module 72b. The wafer conveyance device 70 exhibits an effect that the continuous processing is made possible without reducing the productivity of the device as a whole compared to the case where two kinds of processing are performed in one and the same process module.

Figure 8:
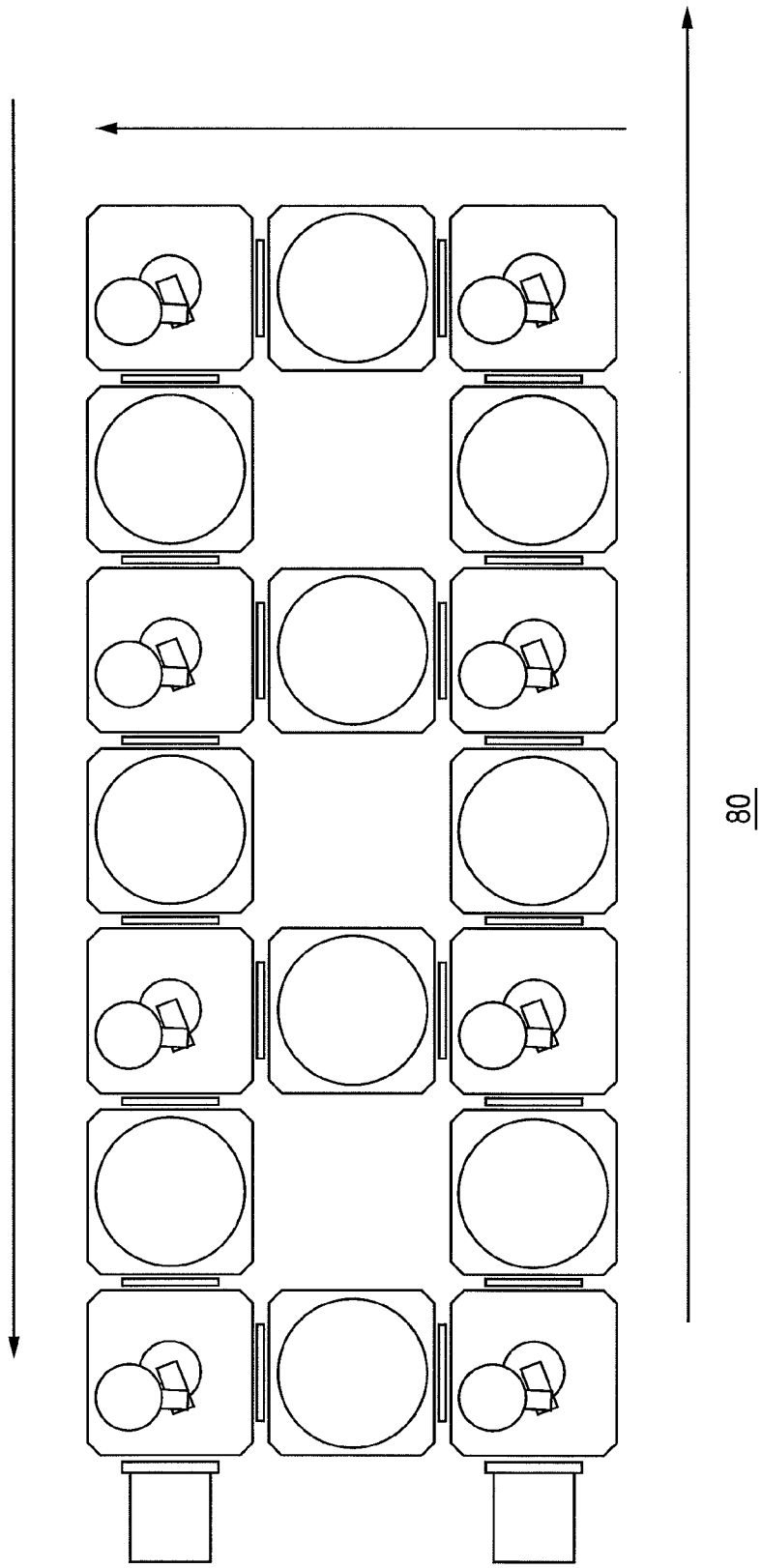
FIG. 8 is a diagram showing another variation of the inline-type wafer conveyance device shown in FIG. 7.
Figure 9:
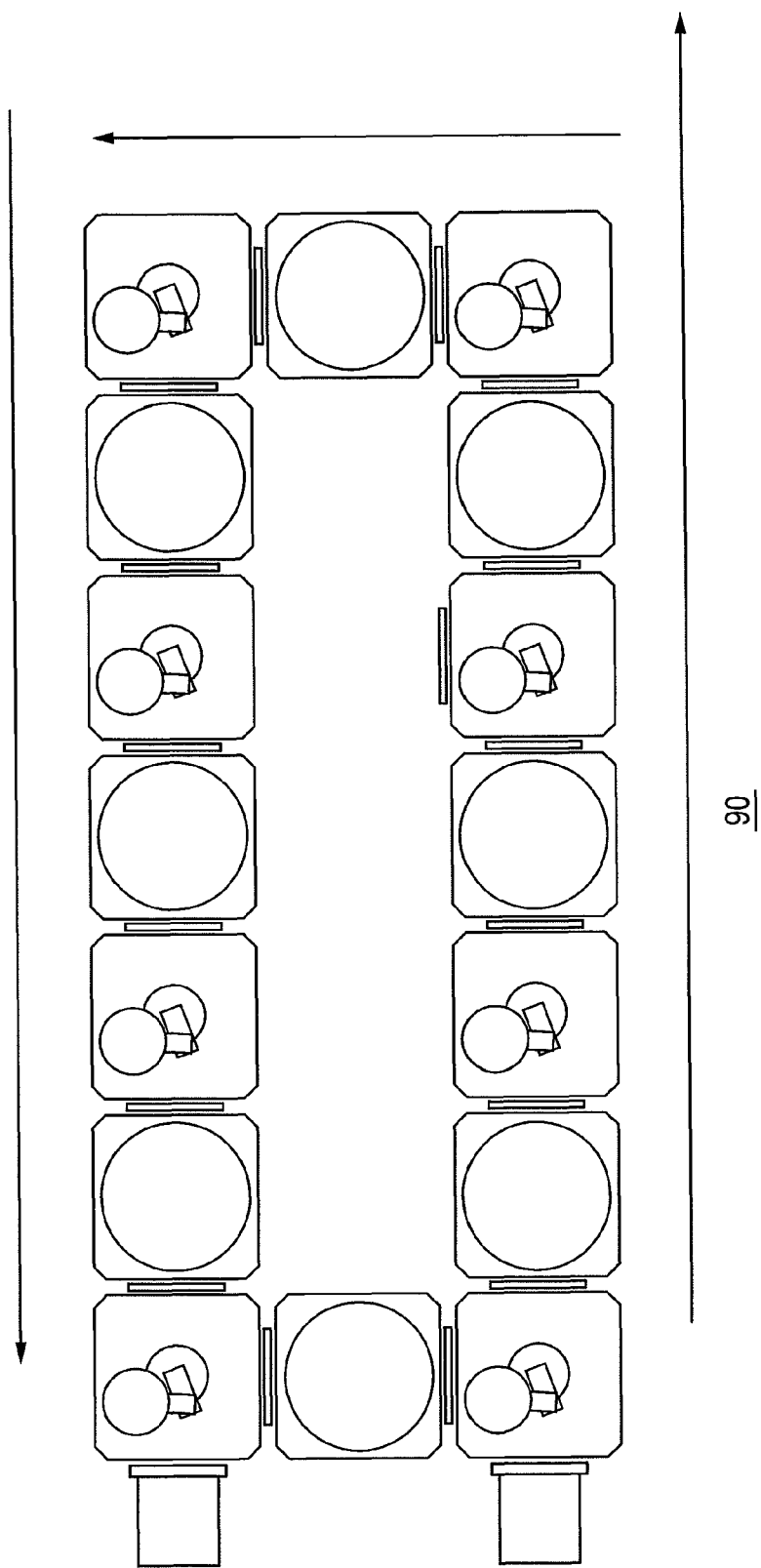
FIG. 9 is a diagram showing another variation of the inline-type wafer conveyance device shown in FIG. 7.
Figure 10:
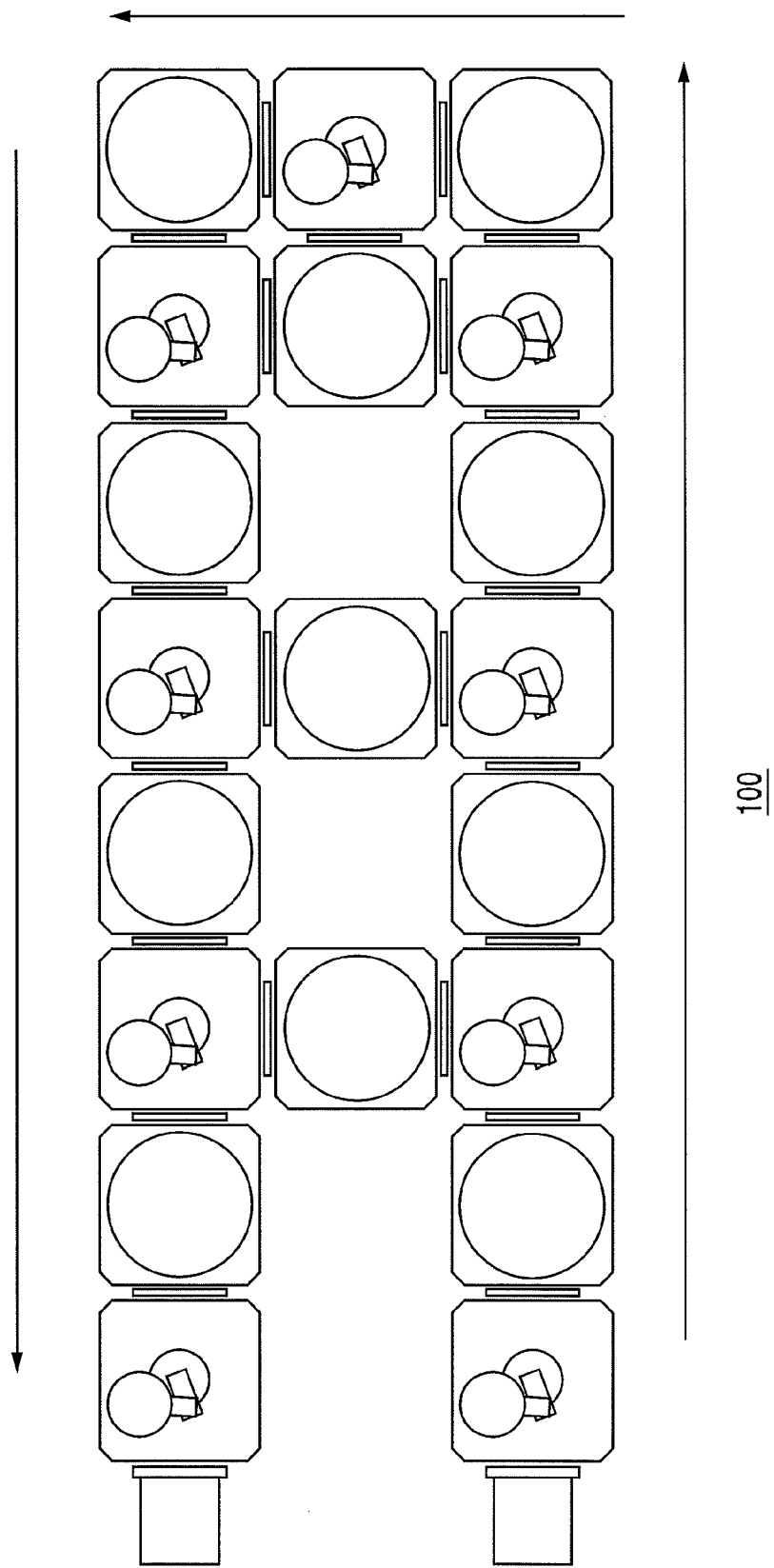
FIG. 10 is a diagram showing another variation of the inline-type wafer conveyance device shown in FIG. 7.

Other variations 80, 90 and 100 of the inline-type wafer conveyance device in the present embodiment are shown in FIG. 8, FIG. 9 and FIG. 10, respectively. These structures also exhibit the same effect as that of the wafer conveyance device 70 in FIG. 7.

Figure 11:
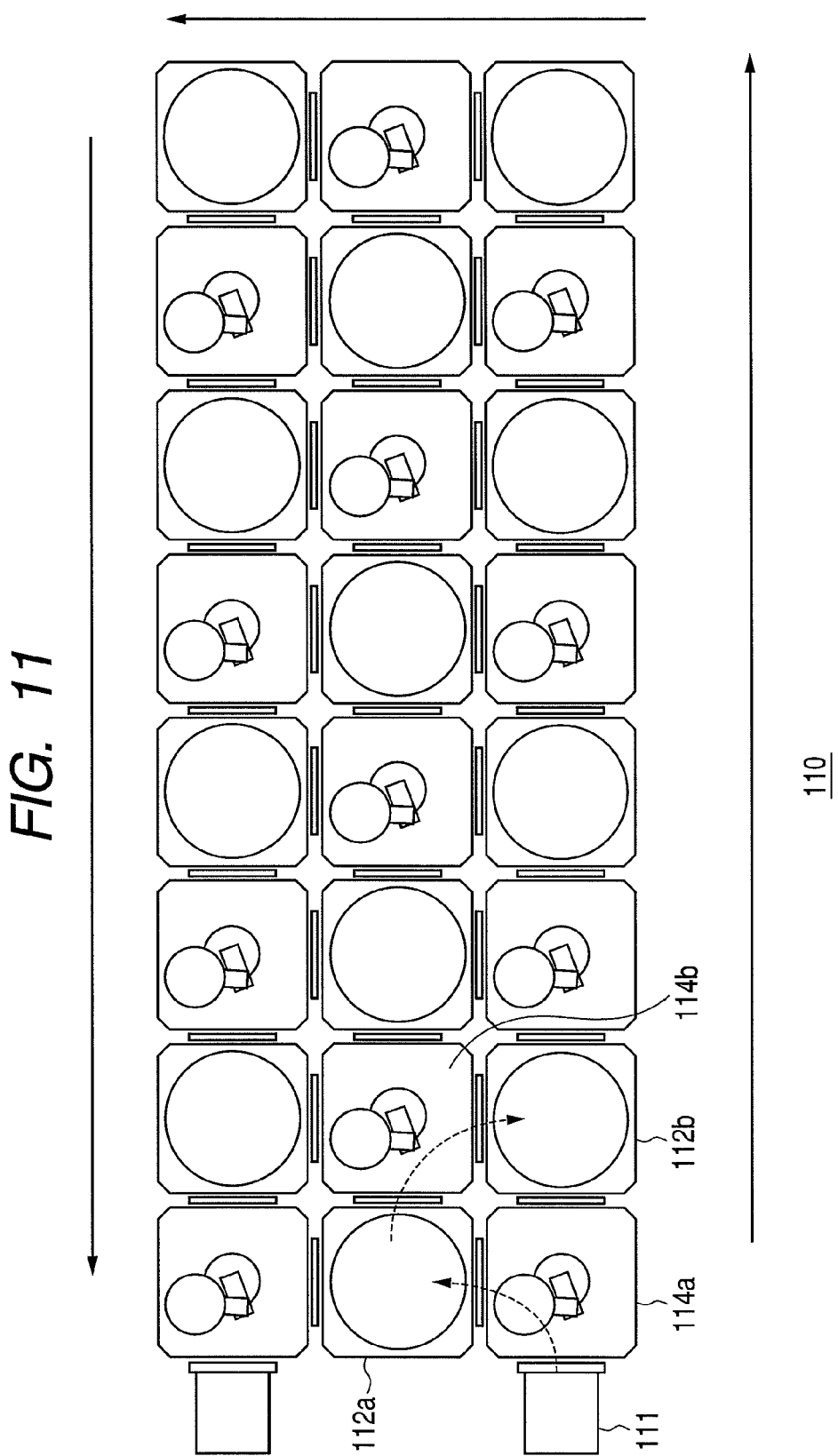
FIG. 11 is a plan view of another configuration example of the inline-type wafer conveyance device shown in FIG. 7.

A plan view of another structure example of the inline-type wafer conveyance device in the present embodiment is shown in FIG. 11. A wafer conveyance device 110 has a structure in which conveyance chambers and process modules are covered alternately with no gap left. In addition to the effect that is realized by the wafer conveyance device 70 shown in FIG. 7, it is also possible to suppress the footprint from increasing when the number of processes to be performed on a wafer is increased. Further, it is possible for the wafer conveyance device 110 to improve the throughput of the device as a whole. For example, it is possible to convey an unprocessed wafer from a load chamber 111 to a process module 112a using a first end conveyance chamber 114a at the same time as conveying a wafer having been subjected to the processing in the process module 112a using a conveyance chamber 114b as shown by dotted line arrows in FIG. 11. Because of this, it is possible to further improve the throughput of the device as a whole as well as exhibiting the effect obtained by the structures in FIGS. 7 to 10.

Third Embodiment

Figure 12:
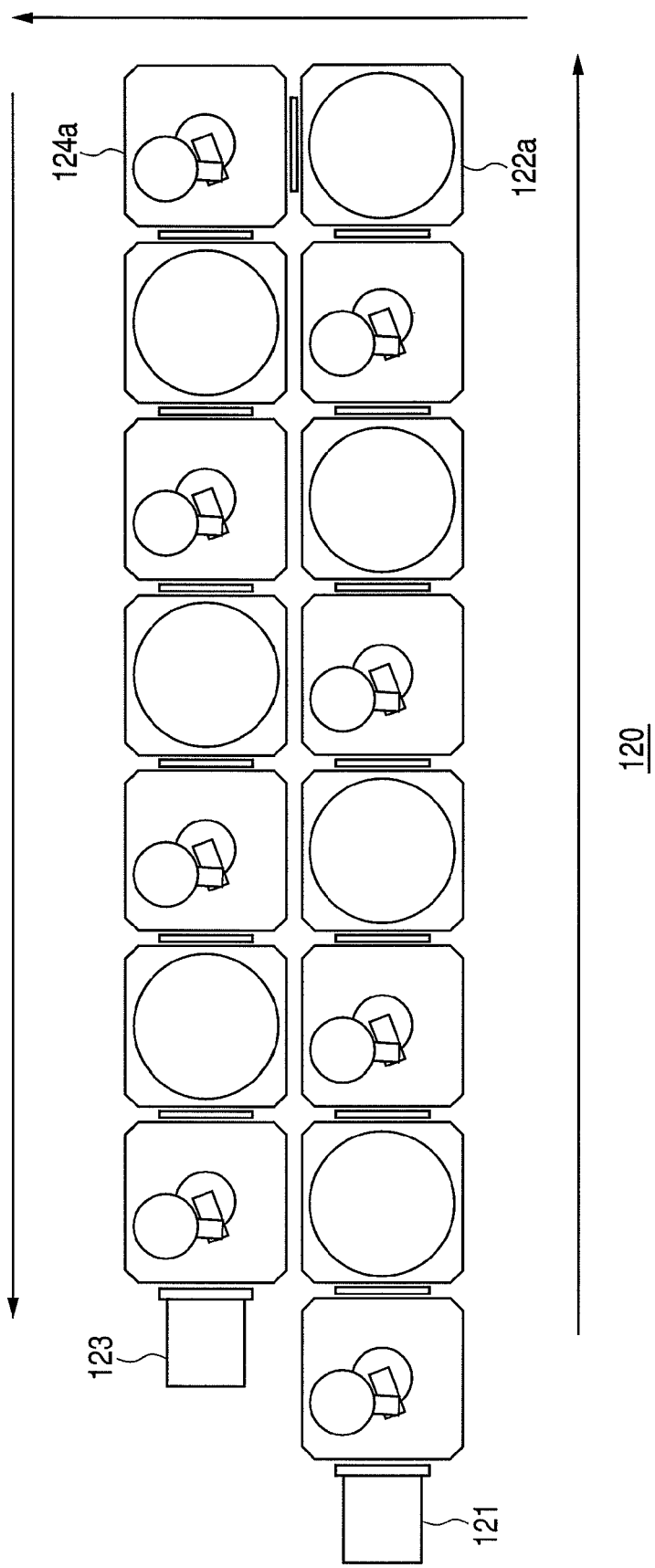
FIG. 12 is a plan view of another embodiment of the inline-type wafer conveyance device according to the present invention.

A plan view of another embodiment of the inline-type wafer conveyance device according to the present invention is shown in FIG. 12. A wafer conveyance device 120 comprises, for example, eight conveyance chambers and seven process modules as shown in FIG. 12, and is capable of continuous processing of seven different processes or seven identical processes. As shown schematically, the overall structure of the wafer conveyance device 120 is not rectilinear but bends at right angles at a process module 122a and an intermediate conveyance chamber 124a.

The process module constituting the wafer conveyance device 120 is basically configured so that its side surfaces in opposition to each other are connected to neighboring conveyance chambers via gate valves. However, in order to realize the bent structure as shown schematically, the one process module 122a has substantially a square plane shape and is configured so that the two side surfaces perpendicular to each other of the four side surfaces are connected to two neighboring conveyance modules, respectively, via two gate valves. Similarly, the side surfaces in opposition to each other of each conveyance chamber are basically coupled to gate valves. However, the one conveyance chamber 124a neighboring to the above-mentioned process module 122a has substantially a square plane shape and is configured so that the two side surfaces perpendicular to each other of the four side surfaces are connected to two neighboring conveyance modules via two gate valves. The plane shape of the process module and the conveyance chamber is not limited to a square. For example, it is possible to employ various plane shapes, such as a circle. In this case, one of the process modules (corresponding to 122a in FIG. 12) is configured so as to be connected to two neighboring conveyance chambers via two gate valves, respectively, and so that the directions of the two gate valves are perpendicular to each other. Further, one of the two conveyance chambers (corresponding to 124a in FIG. 12) is configured so as to be connected to the one process module and to the other process module, respectively, via two gate valves, and so that the directions of these two gate valves are perpendicular to each other.

If compared to the wafer conveyance device 60 in FIG. 6, which is also capable of seven processes, it is possible to make smaller its footprint by eliminating the gap between the row on the side of a load chamber 121 (the lower row in FIG. 12) and the row on the side of an unload chamber (the upper row in FIG. 12). That is, it is possible to make its footprint smaller, in addition to the effect of the wafer conveyance device 60, and the effect that the same throughput can be realized is exhibited.

Figure 13:
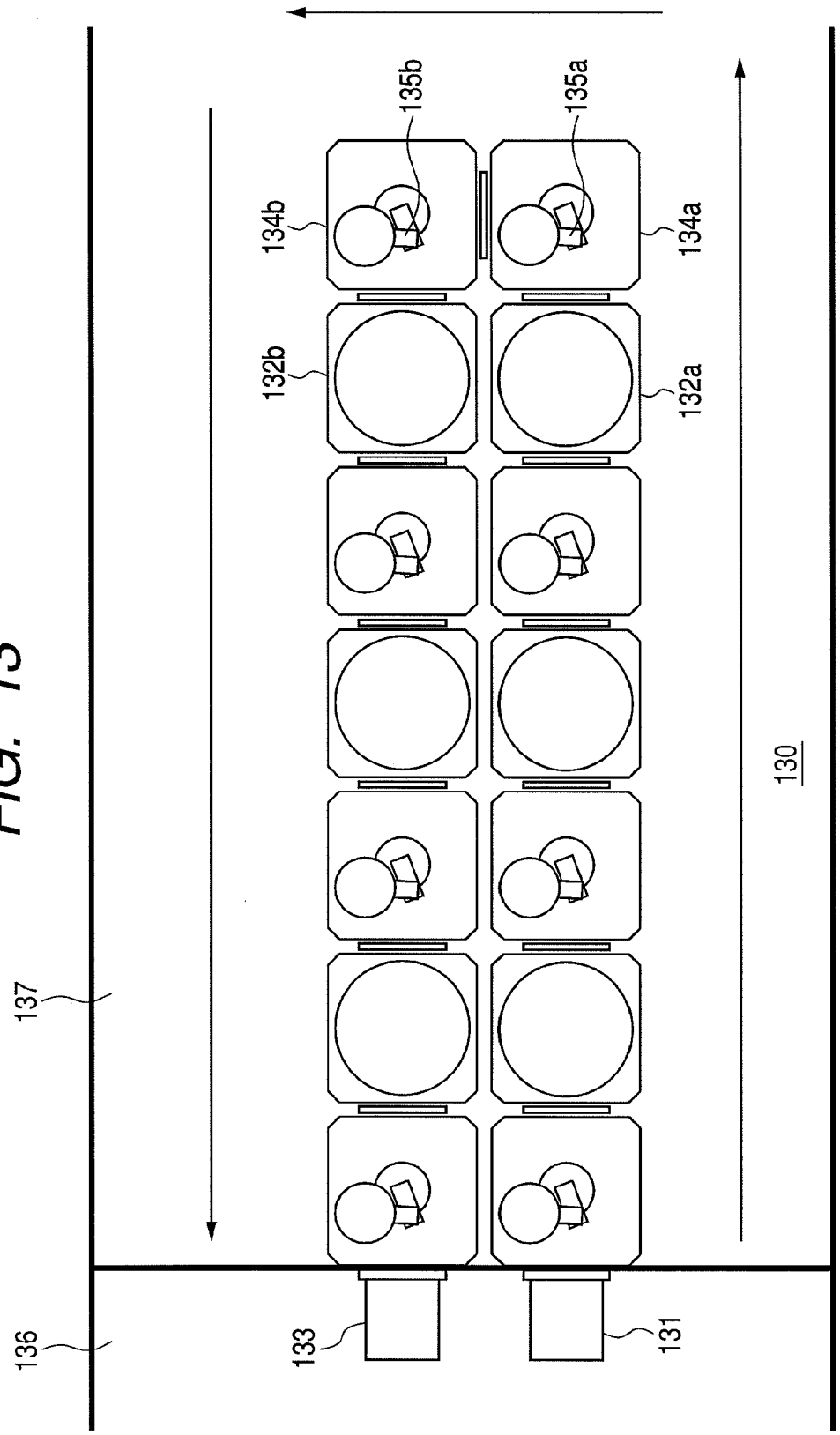
FIG. 13 is a plan view of another structure example of the inline-type wafer conveyance device shown in FIG. 12.

Another structure example of the wafer conveyance device in the present embodiment is shown in FIG. 13. A wafer conveyance device 130 is the same as the wafer conveyance device 120 in FIG. 12 in that there is no extra gap between the row on the side of a load chamber 131 (the lower row) and the row on the side of an unload chamber 133 (the upper row). On the other hand, the wafer conveyance device 130 differs from the wafer conveyance device 120 in that the wafer conveyance device 130 further comprises an intermediate conveyance chamber 134b neighboring to one intermediate conveyance chamber 134a at the end part of the device on the opposite side of the load chamber 131 and the unload chamber 133. These two neighboring intermediate conveyance chambers 134a and 134b have substantially a square plane shape and are connected to each other via one of two side surfaces perpendicular to each other. The respective intermediate conveyance chambers 134a and 134b are connected to respective neighboring process modules 132a and 132b via the other of the two side surfaces perpendicular to each other. A wafer having been subjected to the processing in the process module 132a is delivered to a conveyance mechanism 135b within the neighboring conveyance chamber 134b by a conveyance mechanism 135a within the conveyance chamber 134a.

The plane shape of the intermediate conveyance chamber is not limited to substantially a square shape. It is possible to employ various plane shapes, such as a circle, for example. The intermediate conveyance chambers 134a and 134b in FIG. 13 are connected to each other via gate valves. Further, these two respective intermediate conveyance chambers 134a and 134b are connected to the respective different process modules 132a and 132b via other gate valves the direction of which is different from that of the gate valve.

With this structure, it is possible to arrange the load chamber 131 and the unload chamber 133 so that their positions are aligned as shown in FIG. 13. A factory that actually uses a wafer conveyance device is separated into clean rooms at various particle levels. The wafer conveyance device may be positioned astride two or more clean rooms at different levels. For example, the load chamber 131 and the unload chamber 133 may be arranged in a clean room 136 having a particle density of about 10 ppm and other conveyance chambers and process modules in a clean room 137 having a particle density of about 1,000 ppm. In such a case, it is more convenient from the standpoint of the layout of the factory if the positions of the load chamber and the unload chamber are aligned as shown in FIG. 13. The structure of the wafer conveyance device 130 exhibits a further advantageous effect in this point. Further, the wafer conveyance device 130 exhibits an effect that the footprint is smallest if an even number of process modules are included.

Fourth Embodiment

Figure 14:
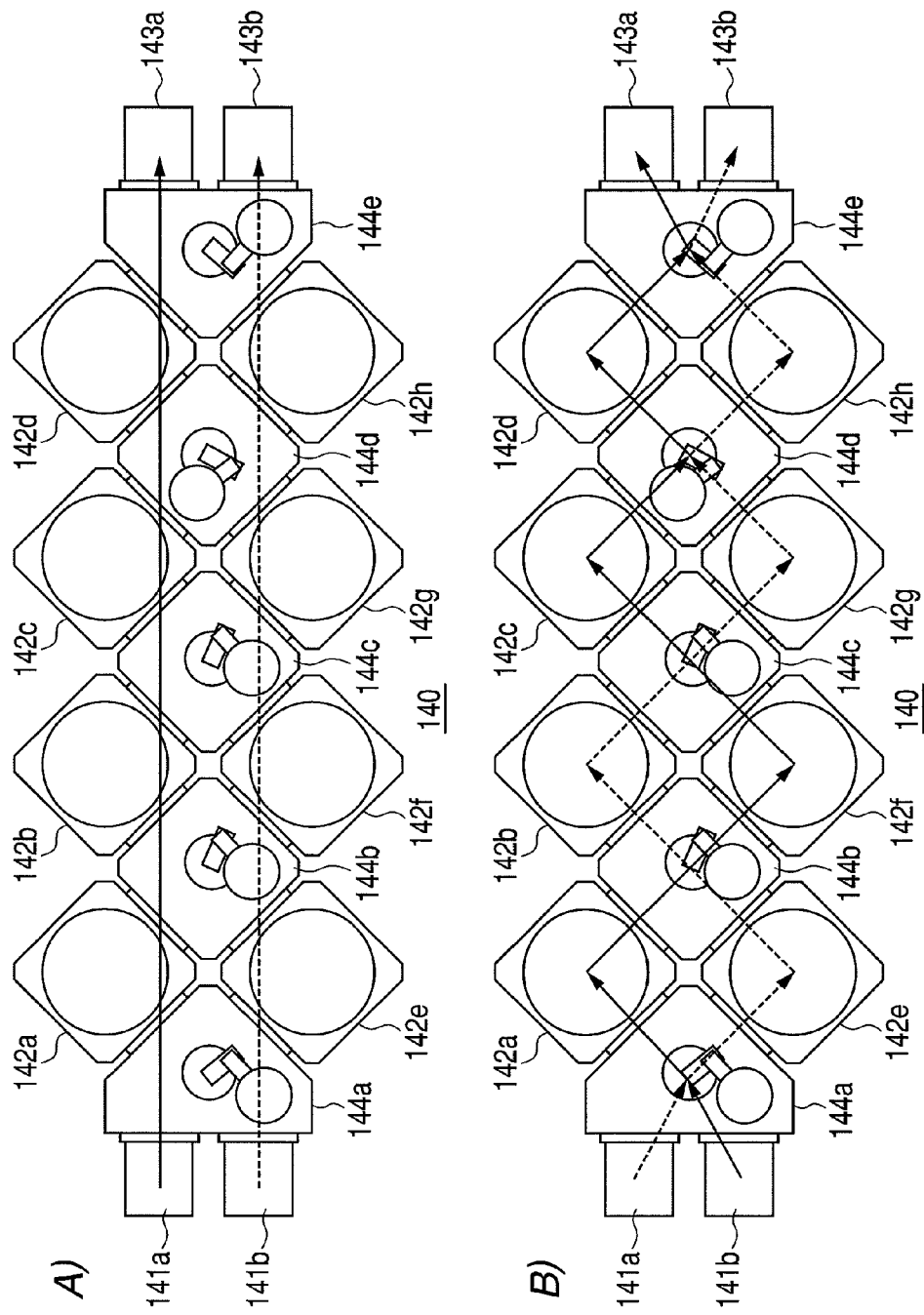
FIG. 14 is plan views of another embodiment of the inline-type wafer conveyance device according to the present invention.

A plan view of another embodiment of the inline-type wafer conveyance device of the present invention is shown in FIG. 14. A wafer conveyance device 140 has a structure, in which the structure of the wafer conveyance device 50 of the present invention shown in FIG. 5 is further modified so as to enable it possible to simultaneously process two wafers. As shown schematically, the wafer conveyance device 140 comprises two load chambers 141a and 141b and two unload chambers 143a and 143b. The process module 52a in the wafer conveyance device 50 is separated into a pair of process modules 142a and 142e capable of independent processing in FIG. 14. A conveyance chamber 144a connected to the load chambers 141a and 141b has two side surfaces via which it is connected to the two process modules 142a and 142e on the opposite side of these load chambers. A conveyance chamber 144e connected to the unload chambers 143a and 143b has also a similar structure. The rest of conveyance chambers, that is, conveyance chambers 144b to 144d have, for example, substantially a square plane shape when viewed from above and have four side surfaces, as shown in FIG. 14.

The process module 142a is configured so that one of two neighboring side surfaces coupled to gate valves is connected to the side surface of the conveyance chamber 144a on the opposite side of the load chamber via a gate valve. The other side surface of the process module 142a is connected to the side surface of the next conveyance chamber 144b on the side of the load chamber via a gate valve. As shown schematically, the process module 142e is also connected to the side surface of the conveyance chamber 144a on the opposite side of the load chamber and to the side surface of the conveyance chamber 144b on the side of the load chamber, similar to the process module 142a.

Other process modules 142b to 142d and 142f to 142h and the conveyance chambers 144b to 144d are connected similarly as shown schematically.

In the wafer conveyance device 140, the conveyance chamber 144a may have three side surfaces via which it is connected to the load chambers 141a and 141b, the process module 142a, and the process module 142e, respectively. The conveyance chamber 144e may also be configured similarly. The other conveyance chambers 144b to 144d can be configured so as to have substantially a square plane shape and have four side surfaces via which they are connected to four neighboring process modules, respectively, as shown schematically. These conveyance chambers 144b to 144d may have, for example, substantially a square plane shape. By configuring each component as described above, it is possible to connect the components with no gap left in between as shown in FIG. 14 and the footprint of the wafer conveyance device 140 can be reduced.

The plane shape of the respective process modules and conveyance chambers is not limited to a square shape. It is possible to employ various plane shapes, such as a circle. In this case, for example, the respective process modules 142a and 142e are connected to the first end conveyance chamber 144a located ahead via one of two gate valves the directions of which are perpendicular to each other and to the intermediate conveyance chamber 144b located behind via the other gate valve. The respective process modules 142b and 142f are connected to the intermediate conveyance chamber 144b located ahead via one of two gate valves the directions of which are perpendicular to each other and to the intermediate conveyance chamber 144c located behind via the other gate valve.

With the wafer conveyance device 140, it is made possible to simultaneously process two wafers. In FIG. 14A, the two load chambers 141a and 141b arranged at the left end of the device are used to stack an unprocessed wafer and the two unload chambers 143a and 143b arranged at the right end of the device are used to stack a processed wafer. When simultaneously processing two wafers using the wafer conveyance device 140, it may be possible to process the two wafers in each process module by transferring them in a rectilinear manner, respectively, as shown in FIG. 14A or to process them by transferring in a zigzag manner as shown in FIG. 14B.

In FIG. 14A, a wafer carried into the wafer conveyance device 140 from the load chamber 141a is transferred sequentially through the process modules 142a to 142d in the upper row and successively subjected to processing, and then carried out of the unload chamber 143a. While the wafer having been subjected to the processing in the process module 142a is transferred to the next process module 142b by the intermediate conveyance chamber 144b, an unprocessed wafer is transferred from the load chamber 141a to the process module 142a by the first end conveyance chamber 144a and processed therein, and therefore, it is possible to process a large number of wafers at high speed. Further, while the wafer having been subjected to the processing in the process module 142b (the first wafer) is transferred to the next process module 142c by the intermediate conveyance chamber 144c, the wafer having been subjected to the processing in the process module 142a (the second wafer) is transferred to the next process module 142b by the intermediate conveyance chamber 144b and processed therein, and an unprocessed wafer (the third wafer) is conveyed to the process module 142a from the load chamber 141a by the first end conveyance chamber 144a and processed therein. As described above, in the present embodiment, it is possible to simultaneously process a plurality of wafers by sequentially sending them to the process chamber, and therefore, the throughput can be improved. Depending on a process, it is also possible to transfer a first unprocessed wafer to the load chamber 141a, process it in the process modules 142a, 142b, 142c and 142d, and after carrying out the wafer to the unload chamber 143a, carry a second unprocessed wafer into the load chamber 141a and process it in the process module.

Similarly, in FIG. 14A, a wafer carried into the wafer conveyance device 140 from the load chamber 141b is successively subjected to the processing in the process modules 142e to 142h in the lower row and carried out of the unload chamber 143b. In this case also, while the wafer having been subjected to the processing in the process module 142e is transferred to the next process module 142f by the intermediate conveyance chamber 144b and processed therein, an unprocessed wafer is transferred from the load chamber 141b to the process module 142e by the first end conveyance chamber 144a and processed therein, and therefore, a large number of wafers can be processed at high speed.

Each chamber is arranged in accordance with a desired order of processes. By configuring the wafer conveyance device 140 so as to include a plurality of different process modules, it is possible to form a film by laminating different films on a wafer transferred through the wafer conveyance device 140. When the order of processing of a wafer is fixed, high-speed processing is made possible by transferring wafer in a rectilinear manner within the wafer conveyance device 140 as in the example shown in FIG. 14A.

As shown in FIG. 14B, the wafer conveyance device 140 in the present embodiment may be configured so that a wafer carried into the device from the load chamber 141a passes through the process modules in a procedure set in advance (not limited only to the upper row or to the lower row) and is carried out from the unload chamber 143a or 143b after having been subjected to processing. The present embodiment exhibits an effect that the degree of freedom of processing is increased because the process modules passed by a wafer can be configured arbitrarily. For example, it is possible to form laminated films having different structures on two wafers to be processed simultaneously.

For example, in the case of a process procedure shown by a solid line arrow in FIG. 14, while a wafer having been subjected to the processing in the process module 142a is transferred to the next process module 142f by the intermediate conveyance chamber 144b and processed therein, an unprocessed wafer is transferred from the load chamber 141b to the process module 142a by the first end conveyance chamber 144a and processed therein, and therefore, a large number of wafers can be processed at high speed.

Figure 15:
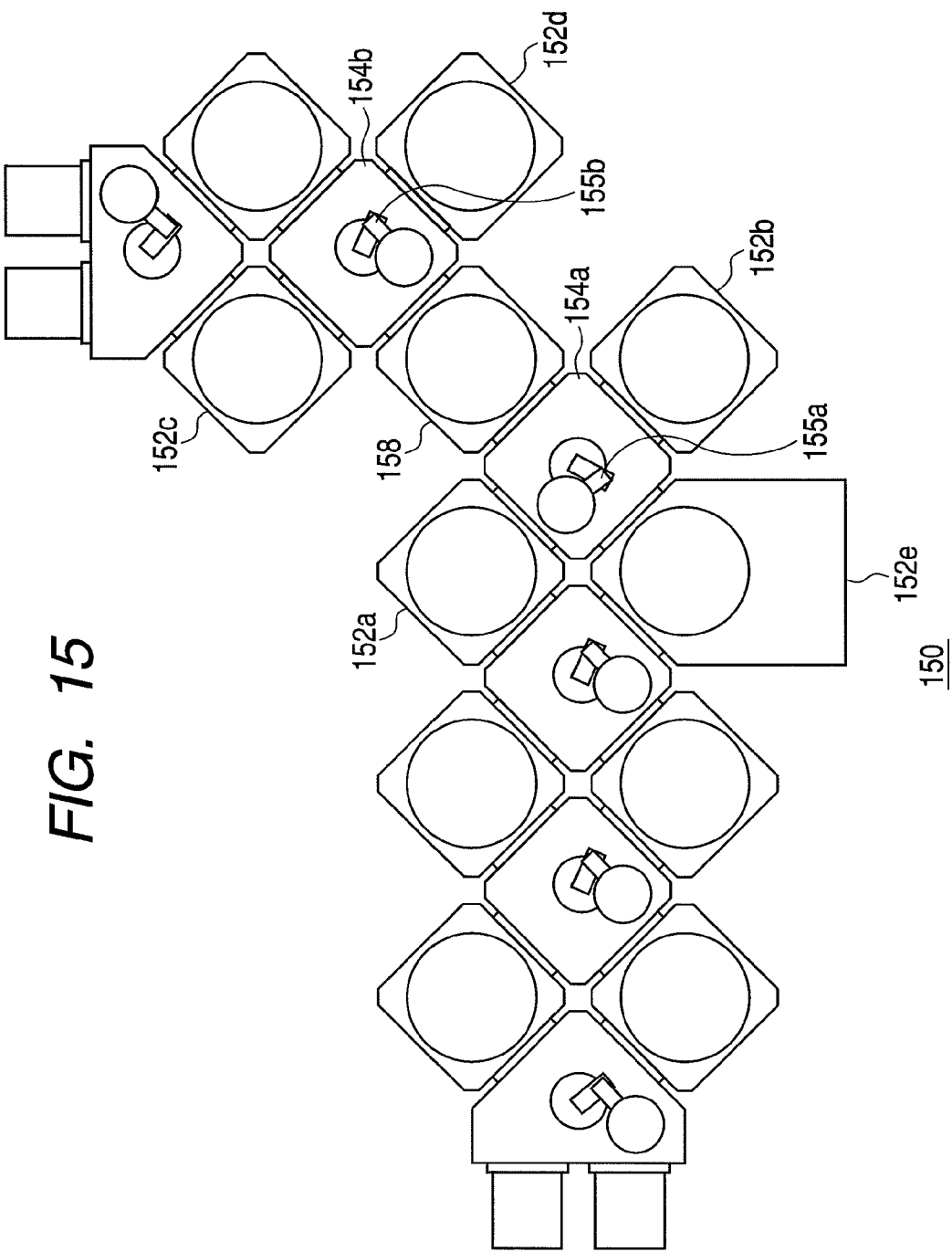
FIG. 15 is a plan view of another structure example of the inline-type wafer conveyance device shown in FIG. 14.

A plan view of another structure example of the wafer conveyance device in the present embodiment is shown in FIG. 15. A wafer conveyance device 150 has a structure, in which the rectilinear structure of the wafer conveyance device 140 in FIG. 14 is bent. A buffer chamber 158 is inserted instead of a certain process module. Unlike the process module, the buffer chamber 158 is configured so that two side surfaces in opposition to each other are connected to neighboring conveyance chambers 154a and 154b via gate valves. This structure enables such a bent structure as shown in FIG. 15. A wafer having been subjected to processing in a process module 152a or 152b is transferred to the buffer chamber 158 using a conveyance mechanism 155a within the conveyance chamber 154a. The wafer is further transferred from the buffer chamber 158 to a process module 152c or 152d by a conveyance mechanism 155b within the conveyance chamber 154b and processed therein. It is also possible to configure the buffer chamber 158 as a chamber that, for example, aligns the position or orientation of a wafer or performs heating processing or cooling processing on a wafer. The process module does not necessarily have a square plane shape, but may have, for example, a pentagonal plane shape as 152e. In this case also, it is possible to keep the footprint as small as possible by configuring the wafer conveyance device 150 so that the process module comes into contact with two neighboring conveyance chambers with no extra gap, as in the present embodiment.

When the number of processes to be performed on a wafer is increased, the length of the wafer conveyance device 140 shown in FIG. 14 is also increased. However, there may be a case where it is not possible to ensure a space to install a device having such a rectilinear structure in a factory. With the embodiment in FIG. 15, it is possible to easily realize a wafer conveyance device having a structure in accordance with the shape of an installation site by inserting one or more buffer chambers into the device.

Figure 16:
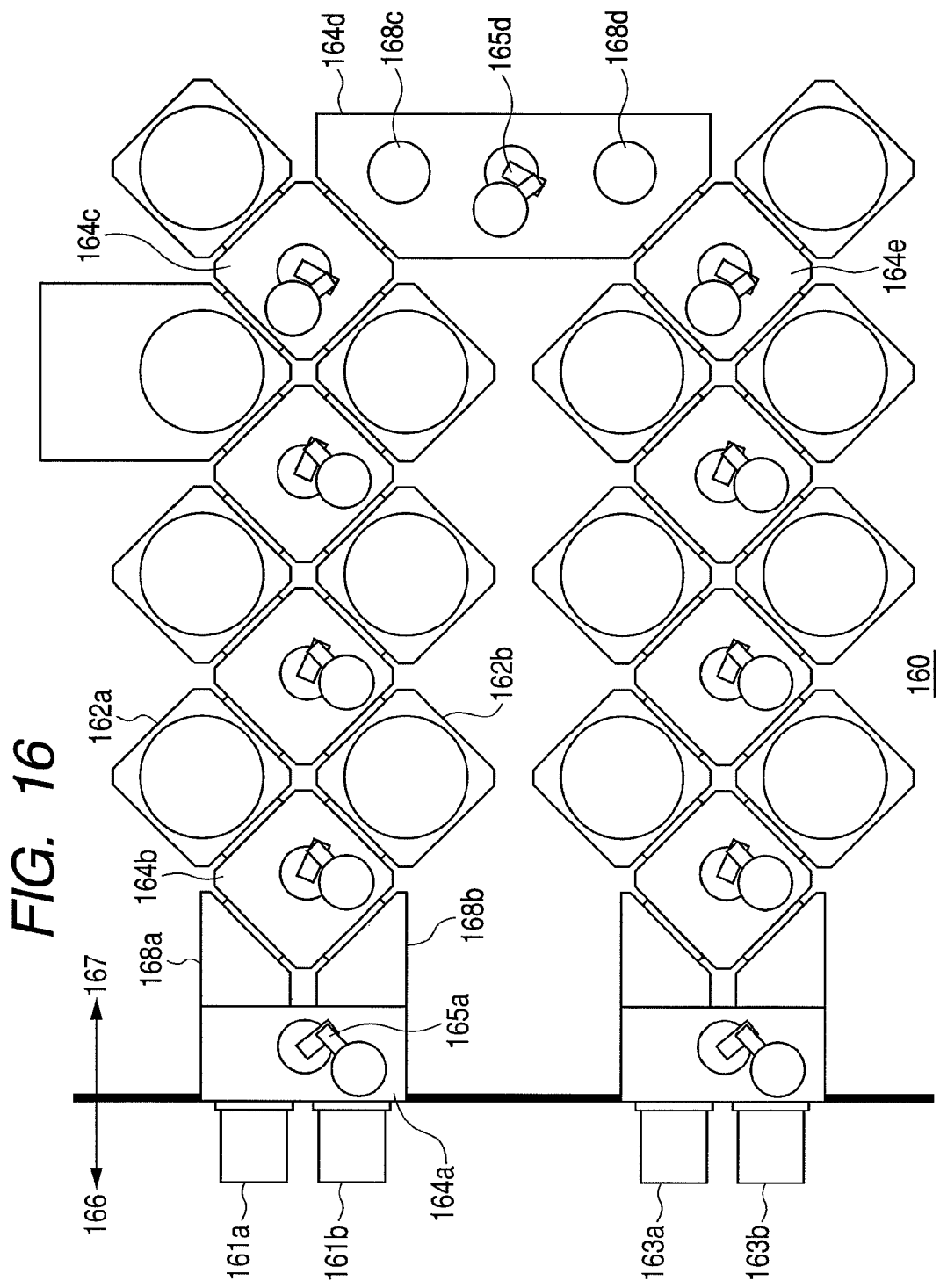
FIG. 16 is a plan view of another structure example of the inline-type wafer conveyance device shown in FIG. 14.

A plan view of another structure example of the wafer conveyance device in the present embodiment is shown in FIG. 16. The structure is such that the wafer conveyance device 140 in FIG. 14 is changed into a U-shape in which the two load chambers 141*a* and 141*b* and the two unload chambers 143*a* and 143*b* are provided at both end parts. In FIG. 16, a conveyance chamber 164*a* is connected to load chambers 161*a* and 161*b* and to the conveyance chamber 164*a*, two buffer chambers 168*a* and 168*b* are connected. These two buffer chambers are connected to two side surfaces of a next conveyance chamber 164*b*, on the side of the load chamber, respectively. After once transferred into the buffer chamber 168*a* or 168*b* from the load chamber 161*a* or 161*b* by the conveyance chamber 164*a*, an unprocessed wafer is carried into a process module 162*a* or 162*b* by the conveyance chamber 164*b* and processed therein. As in the other embodiment described above, it is also possible to employ a structure including the load chambers 141*a* and 141*b*, and 144*a* as shown in FIG. 14 instead of the load chambers 161*a* and 161*b*, the conveyance chamber 164*a*, the buffer chambers 168*a* and 168*b*, and the conveyance chamber 164*b*.

A wafer conveyance device 160 is characterized by comprising an extended conveyance chamber 164*d* configured to connect the structure on the side of the load chamber of the wafer conveyance device 160 (upper row part in FIG. 16) and the structure on the side of the unload chamber (lower row part in FIG. 16). The structure is such that one of the process modules in FIG. 14 is replaced with the extended conveyance chamber 164*d*. The wafer conveyance device in the present embodiment is configured by arranging the process modules in twos side by side in parallel as shown in FIG. 14. Consequently, it is not possible to realize a U-shaped structure even by inserting a normal conveyance chamber or process module between the upper row part and the lower row part as shown in FIG. 6 and FIG. 7 because they do not have a size large enough to connect the upper row part and the lower row part in FIG. 14. In the embodiment shown in FIG. 16, it is made possible to realize a U-shaped structure by using an extended conveyance chamber 164*c* configured by extending a normal conveyance chamber.

The extended conveyance chamber 164*c* has a conveyance mechanism 165*d* located substantially in the center part and buffer parts 168*c* and 168*d* located on both sides thereof. A wafer is placed in the buffer part 168*c* by the conveyance chamber 164*c* neighboring to the extended conveyance chamber 164*d*, transferred to the buffer part 168*d* on the opposite side by the conveyance mechanism 165*d*, and further transferred to the subsequent process module by a conveyance chamber 164*e* neighboring to the extended conveyance chamber 164*d*.

In the wafer conveyance device 160, it is possible to arrange the load chambers 161*a* and 161*b* and unload chambers 163*a* and 163*b* with their positions aligned because of its U-shaped structure. Because of this, the wafer conveyance device 160 has the characteristic that it can be easily positioned astride two clean rooms 166 and 167 at different levels as in the wafer conveyance device 130 in FIG. 13. In addition to this, it is possible to flexibly realize an inline-type wafer conveyance device having a structure in accordance with the layout of an installation space by utilizing the extended conveyance chambers 164*d* having various shapes.

Figure 17:
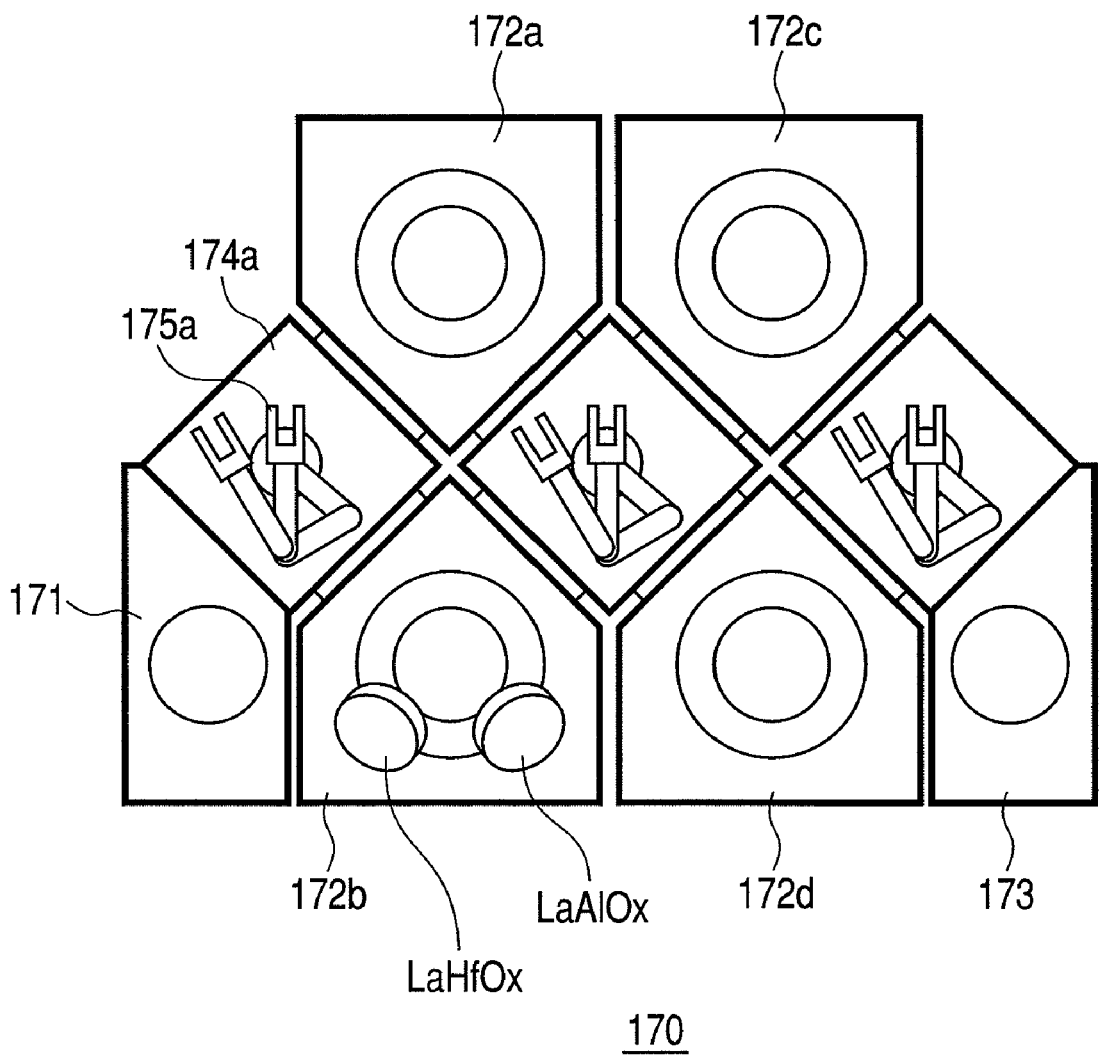
FIG. 17 is a diagram showing how to perform an actual process using a structure similar to that of the inline-type wafer conveyance device shown in FIG. 14.

The way an actual process is performed using an inline-type wafer conveyance device 170 having a structure similar to that of the wafer conveyance device in the present embodiment shown in FIG. 14 is shown in FIG. 17. It is supposed that an insulating film, such as LaHfOx and LaAlOx, used in a semiconductor device is formed on a wafer.

First, an unprocessed wafer is carried into a load chamber 171 from the outside (atmosphere side) of the load chamber 171 and then the load chamber 171 is evacuated using an evacuation mechanism (not shown schematically). Next, the unprocessed wafer is carried into a first process module 172*a* using a first wafer holding means 175*a* constituting a conveyance mechanism within a first end conveyance chamber 174*a* and degassing processing or pre-cleaning is performed on the wafer. Next, within a second process module 172*b*, a film, such as LaHfOx and LaAlOx, or a laminated film including them is formed on the wafer by RF sputtering. For example, the second process module 172*b* internally includes a cathode electrode that holds a target material LaHfOx or LaAlOx. When, for example, argon (Ar) gas is introduced through a gas introduction inlet (not shown schematically) into the second process module 172*b* and further, RF power is applied to the cathode electrode, plasma is generated within the process module 172*b*. Ar ions etc. drawn out from the plasma collide with the target and thus a desired film is formed on the wafer as sputtered particles. UHV annealing is performed on the wafer within a third process module 172*c* and further, predetermined processing is performed within a fourth process module 172*d* as needed, and then, the processed wafer is finally carried out from an unload chamber 173. Each conveyance chamber may have a double arm structure including two arms as shown schematically.

Figure 18:
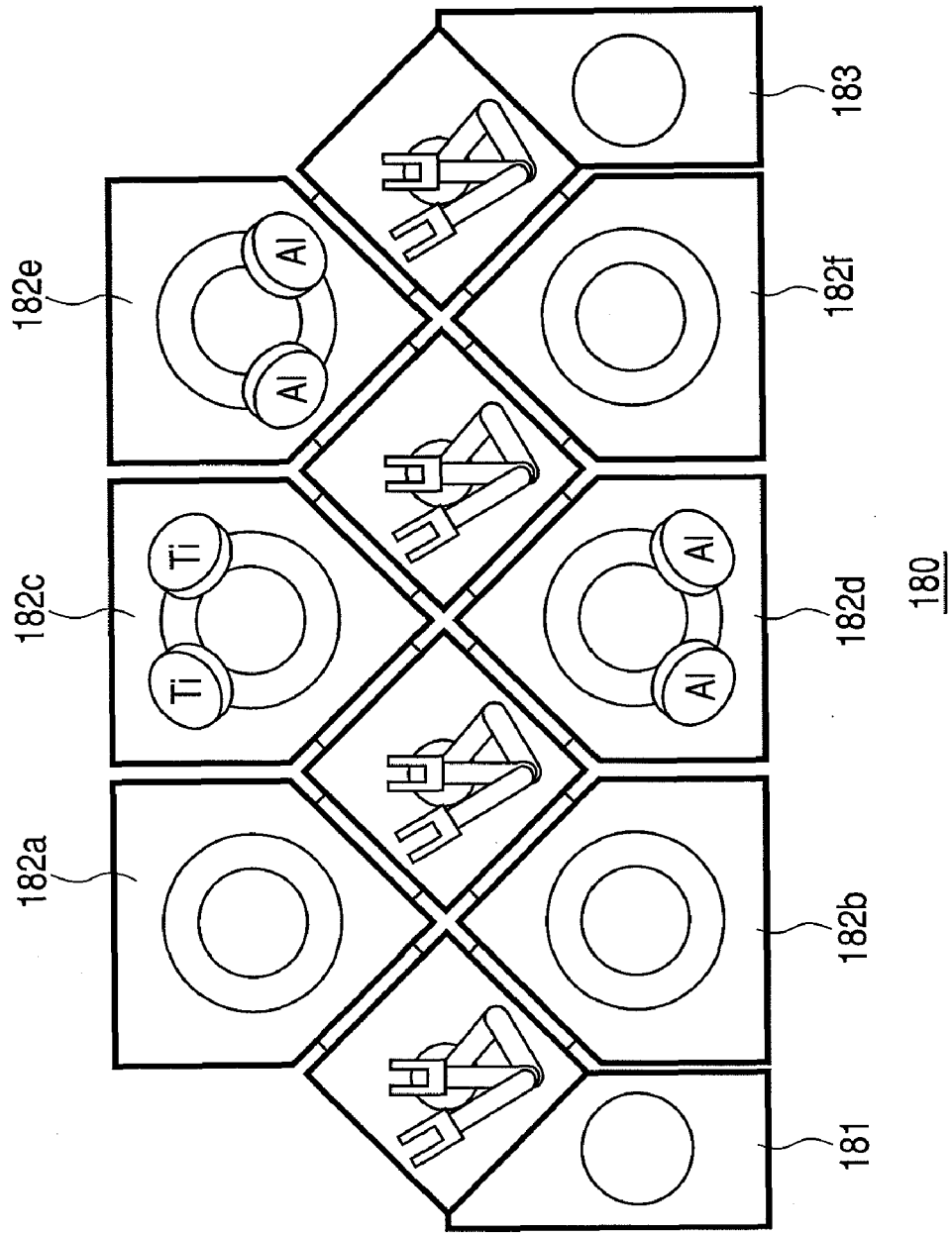
FIG. 18 is a diagram showing a case where an actual process is performed after further adding two process modules and one intermediate conveyance chamber to the inline-type wafer conveyance device illustrated in FIG. 17.

FIG. 18 shows a case where an actual process is performed after adding a fifth process module 182*e*, a sixth process module 182*f*, and one intermediate conveyance chamber to the inline-type wafer conveyance device illustrated in FIG. 17. A flow of procedure for forming a wiring Al film including via hole embedment used in a memory device is supposed and the film structure is designed as, for example, Ti (20 nm)/TiN (60 nm)/Seed-Al (200 nm)/Fill-Al (450 nm).

First, an unprocessed wafer is carried into a load chamber 181 from outside (atmosphere side) and the load chamber 181 is evacuated. Next, after the unprocessed wafer is carried into a first process module 182*a*, degassing processing is performed on the wafer and pre-cleaning of the wafer surface is performed within a second process module 182*b*. Next, the wafer is carried into a third process module 182*c*, and a titanium film (for example, 20 nm) and a TiN film (for example, 60 nm) are formed sequentially. Next, the wafer is carried into a fourth process module 182*d* from the third process module 182*c* and a Seed-Al film (for example, 200 nm) is formed. Next, the wafer is carried into the fifth process module 182*e* from the fourth process module 182*d* and a Fill-Al film (for example, 450 nm) is formed. Next, the wafer is carried into the sixth process module 182*f* from the fifth process module 182*e*, and after cooled down, the wafer is carried out from an unload chamber 183 to outside (atmosphere side). In FIG. 18, the Ti film having a thickness of 20 nm is formed in 182*c* and the Seed-Al film having a thickness of 200 nm is formed in 182*d*, however, by preparing the two process modules 182*c*, it is also possible to form a Ti film having a thickness of 10 nm in the first process module and form a Ti film having a thickness of 10 nm in the second process module, and then form a Ti film having a total thickness of 20 nm. For example, if the film formation in 182*c* requires two minutes and the film formation in 182*d* requires one minute, by preparing the two chambers 182*c*, it is possible to eliminate a wafer that waits for processing and the throughput can be improved as a result.

Figure 19:
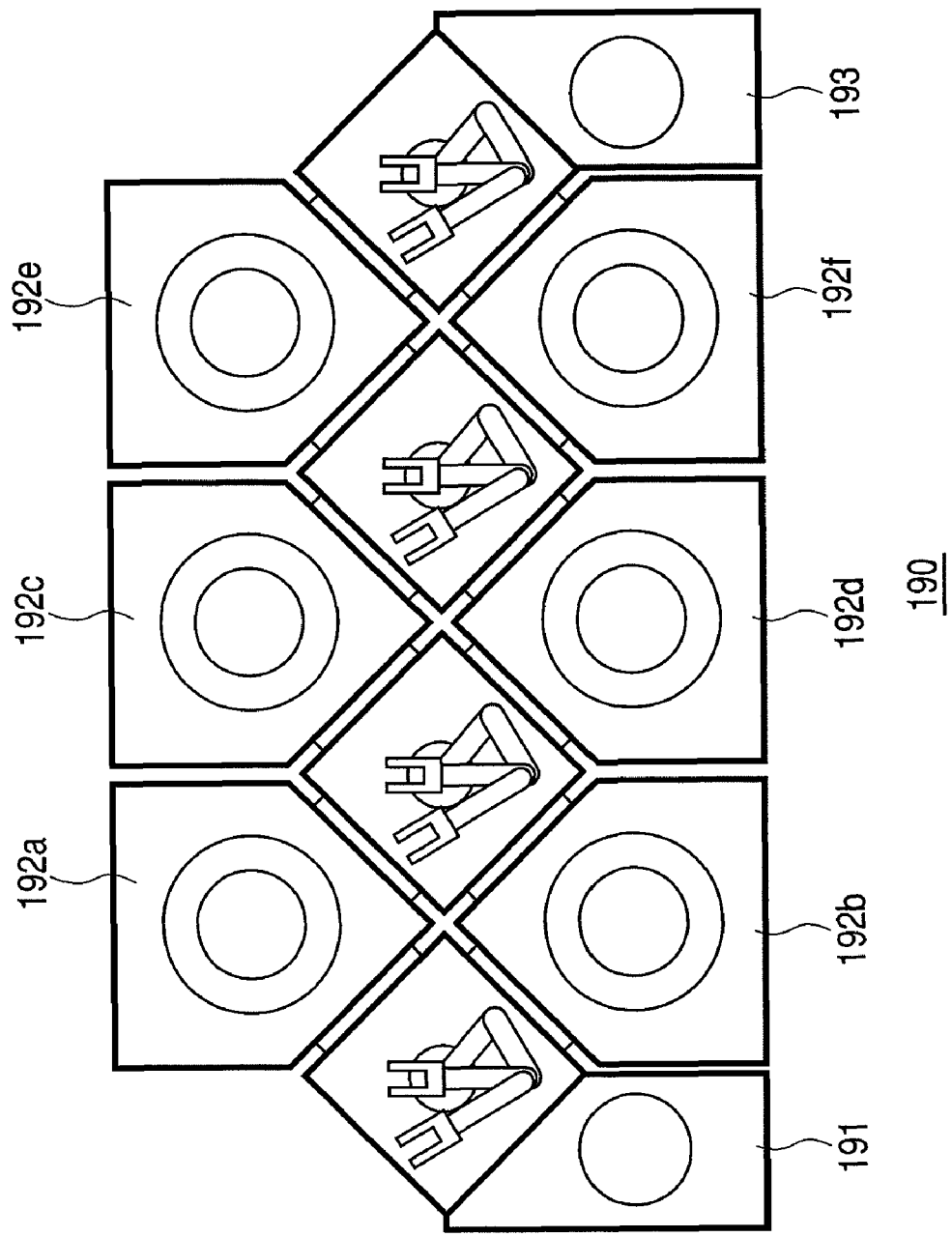
FIG. 19 is a diagram showing a case where an actual process is performed after further adding two process modules and one intermediate conveyance chamber to the inline-type wafer conveyance device illustrated in FIG. 17.

FIG. 19 shows a case where an actual process is performed after further adding a fifth process module 192e and a sixth process module 192f, and one intermediate conveyance chamber to the inline-type wafer conveyance device illustrated in FIG. 17. A supposed process is a processing/film formation continuous process for forming a cover film by CVD after etching a laminated magnetic film without exposing it to the atmosphere. For example, the structure of a film to be etched is PR/Ta/TMR. An unprocessed wafer is carried into a load chamber 191. First, according to the need, trimming of a resist is performed in a first process module 192a and reactive ion etching (RIE) is performed on a Ta film with a $CF_4$-based gas using the resist as a mask in a second process module 192b. Further, the resist is removed within the same process module 192b for the purpose of resist peeling. After the wafer is transferred to a third process module 192c, RIE is performed on a laminated magnetic film having a TMR structure in a $CH_3OH$ process. Further, the wafer is transferred to a fourth process module 192d and ion beam etching (IBE) is performed for the purpose of the surface cleaning after RIE with $CH_3OH$. After the wafer having been subjected to IBE is transferred continuously in a vacuum, a nitride film, an oxide film, or a carbon film, etc., is formed by the plasma CVD or remote plasma CVD in the fifth process module 192e. After predetermined processing is performed in the sixth process module 192f, the wafer is carried out from an unload chamber 193.

Figure 20:
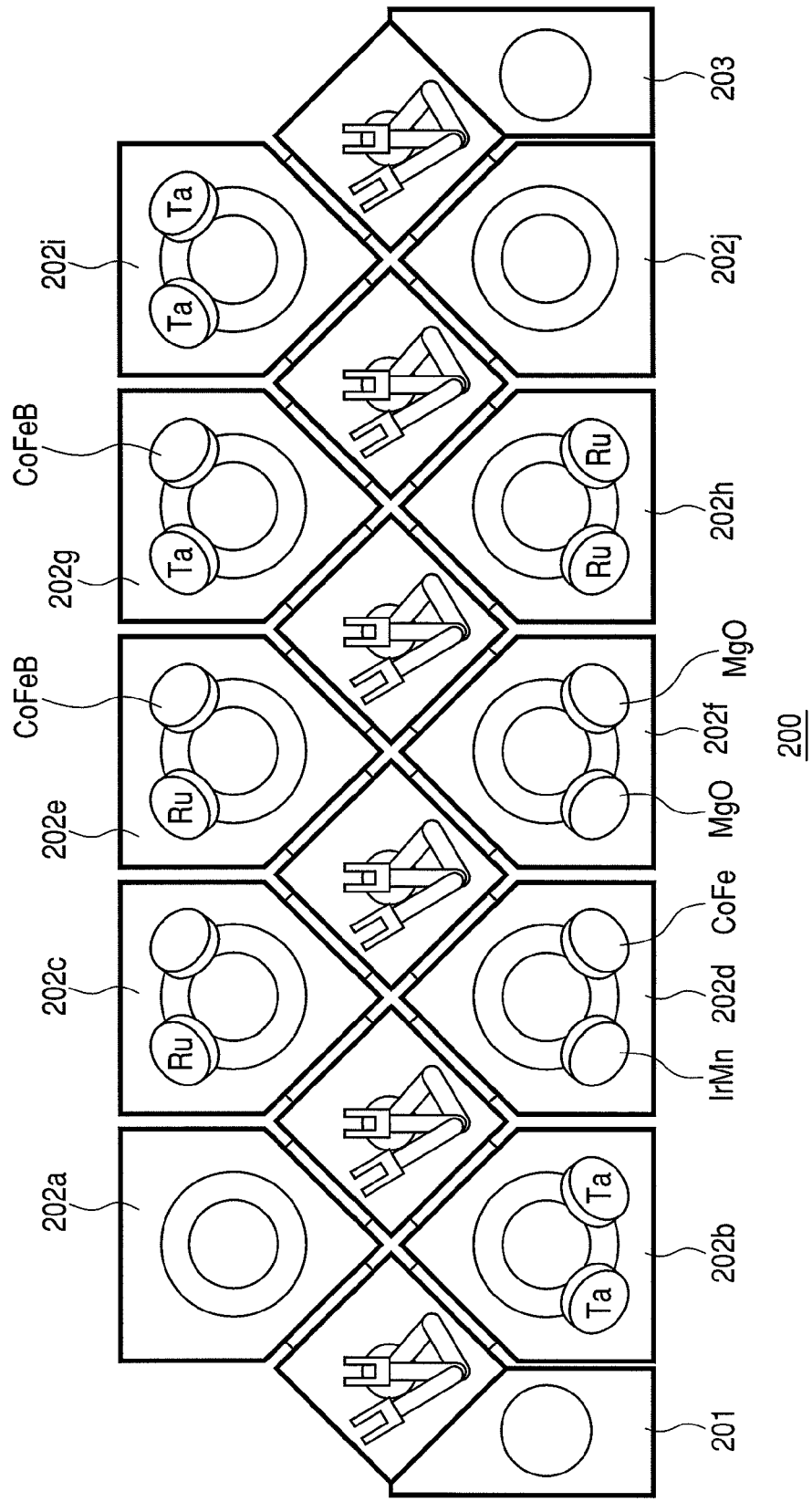
FIG. 20 is a diagram showing a case where an actual process is performed after adding further four process modules and two intermediate conveyance chambers to the inline-type wafer conveyance device as shown in FIG. 18.

FIG. 20 shows a case where an actual process is performed using a wafer conveyance device 200 having a structure in which four process modules and two intermediate conveyance chambers are further added to the inline-type wafer conveyance device as shown in FIG. 18. A flow of procedure for forming a TMR laminated film of a storage cell part used in a magnetic resistance random access memory (MRAM) is supposed. The film structure is designed as, for example, Ta (20 nm)/Ru (5 nm)/IrMn (7 nm)/CoFe (2.5 nm)/Ru (0.9 nm)/ CoFeB (3 nm)/MgO (1 nm)/CoFeB (3 nm)/Ta (2 nm)/Ru (10 nm)/Ta (30 nm).

After etching processing is performed in a first process module 202a, a Ta film (for example, 20 nm) is formed in a second process module 202b, a Ru film (for example, 5 nm) in a third process module 202c, an IrMn film (for example, 7 nm) and a CoFe film (for example, 2.5 nm) in a fourth process module 202d, and a Ru film (for example, 0.9 nm) and a CoFeB film (for example, 3 nm) in a fifth process module 202e, respectively, by DC sputtering. Further, a MgO film (for example, 1 nm) is formed by RF sputtering in a sixth process module 202f, and a CoFeB film (for example, 3 nm) and a Ta film (for example, 2 nm) are formed by DC sputtering in a seventh process module 202g, a Ru film (for example, 10 nm) in an eighth process module 202h, and a Ta film (for example, 30 nm) in a ninth process module 202i, respectively. Further, predetermined processing is performed in a tenth process module 202j. In the above-mentioned process, the MgO film is formed by RF sputtering. In FIG. 20, the Ta film having a thickness of 20 nm is formed in 202b and the Ru film having a thickness of 5 nm is formed in 202c, however, by preparing the two process modules 202b, it is also possible to form a Ta film having a thickness of 10 nm in the first process module and form a Ta film having a thickness of 10 nm in the second process module and then form a Ta film having a total thickness of 20 nm. For example, if the film formation in 202b requires two minutes and the film formation in 202c requires one minute, by preparing the two chambers 202b, it is possible to eliminate a wafer that waits for processing and thus the throughput can be improved as a result.

Figure 21:
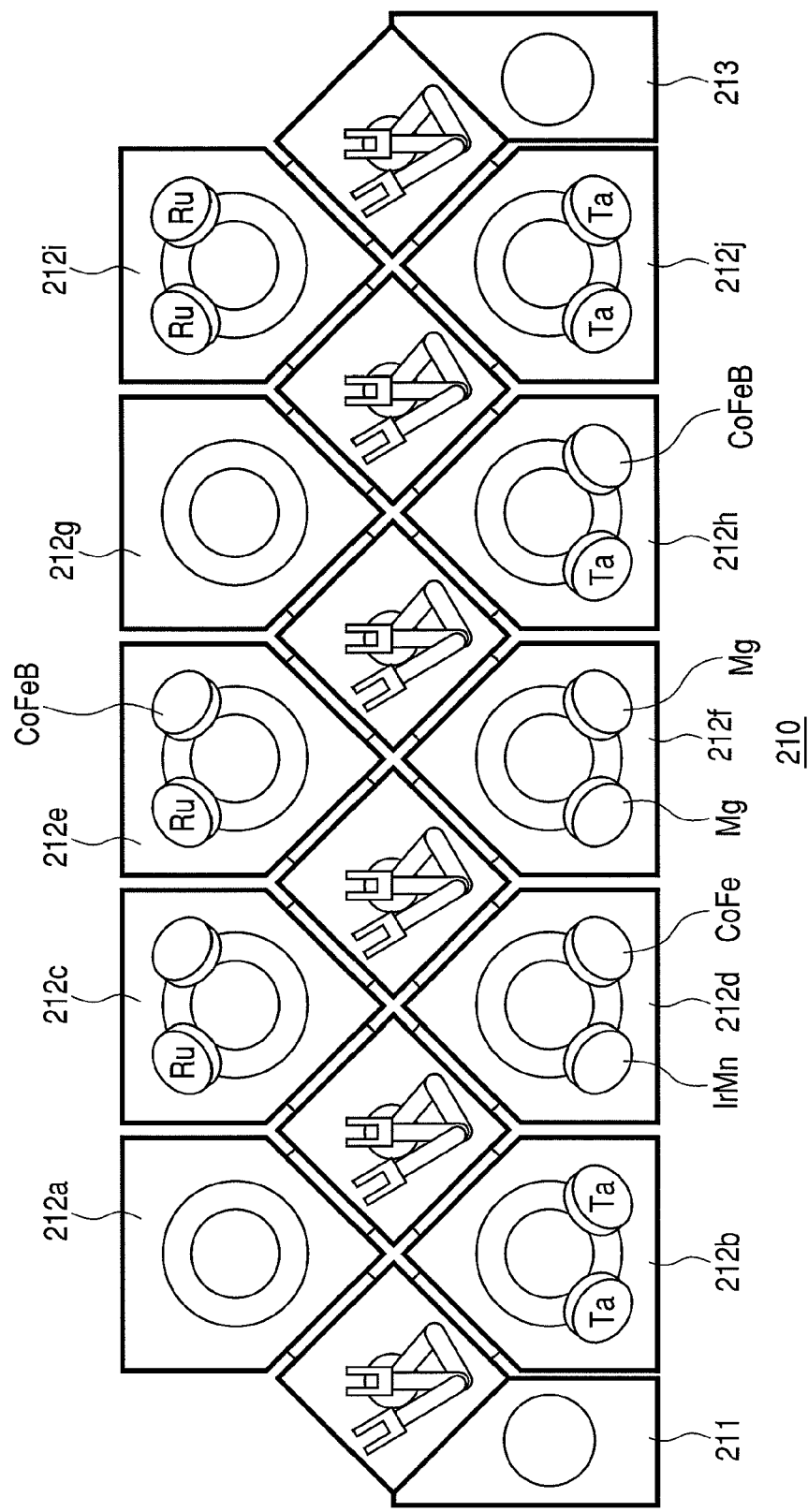
FIG. 21 is a diagram showing a case where an actual process is performed using an inline-type wafer conveyance device similar to that in FIG. 20.

FIG. 21 shows a case where an actual process is performed using an inline-type wafer conveyance device 210 similar to that in FIG. 20. A flow of procedure for forming a TMR laminated film in a storage cell part used in MRAM is supposed. The film structure is designed as, for example, Ta (20 nm)/Ru (5 nm)/IrMn (7 nm)/CoFe (2.5 nm)/Ru (0.9 nm)/ CoFeB (3 nm)/MgO (1 nm)/CoFeB (3 nm)/Ta (2 nm)/Ru (10 nm)/Ta (30 nm).

After etching processing is performed in a first process module 212a, a Ta film (for example, 20 nm) is formed in a second process module 212b, a Ru film (for example, 5 nm) in a third process module 212c, an IrMn film (for example, 7 nm) and a CoFe film (for example, 2.5 nm) in a fourth process module 212d, a Ru film (for example, 0.9 nm) and a CoFeB film (for example, 3 nm) in a fifth process module 212e, and a Mg film (for example, 1 nm) in a sixth process module 212f, and the Mg film is oxidized in a seventh process module 212g. Further, a CoFeB film (for example, 3 nm) and a Ta film (for example, 2 nm) are formed in an eighth process module 212h, a Ru film (for example, 10 nm) in a ninth process module 212i, and a Ta film (for example, 30 nm) in a tenth process module 212j. In the above-mentioned process, the MgO film is formed by oxidation after forming the Mg film by DC sputtering. The first process module 212a is an etching module and the seventh process module 212g is an oxidation module. In FIG. 21, the Ta film having a thickness of 20 nm is formed in 212b and the Ru film having a thickness of 5 nm is formed in 212c, however, by preparing the two process modules 212b, it is also possible to form a Ta film having a thickness of 10 nm in the first process module and form a Ta film having a thickness of 10 nm in the second process module and then form a Ta film having a total thickness of 20 nm. For example, if the film formation in 212b requires two minutes and the film formation in 212c requires one minute, by preparing the two chambers 212b, it is possible to eliminate a wafer that waits for processing and thus the throughput can be improved as a result.

Figure 22:
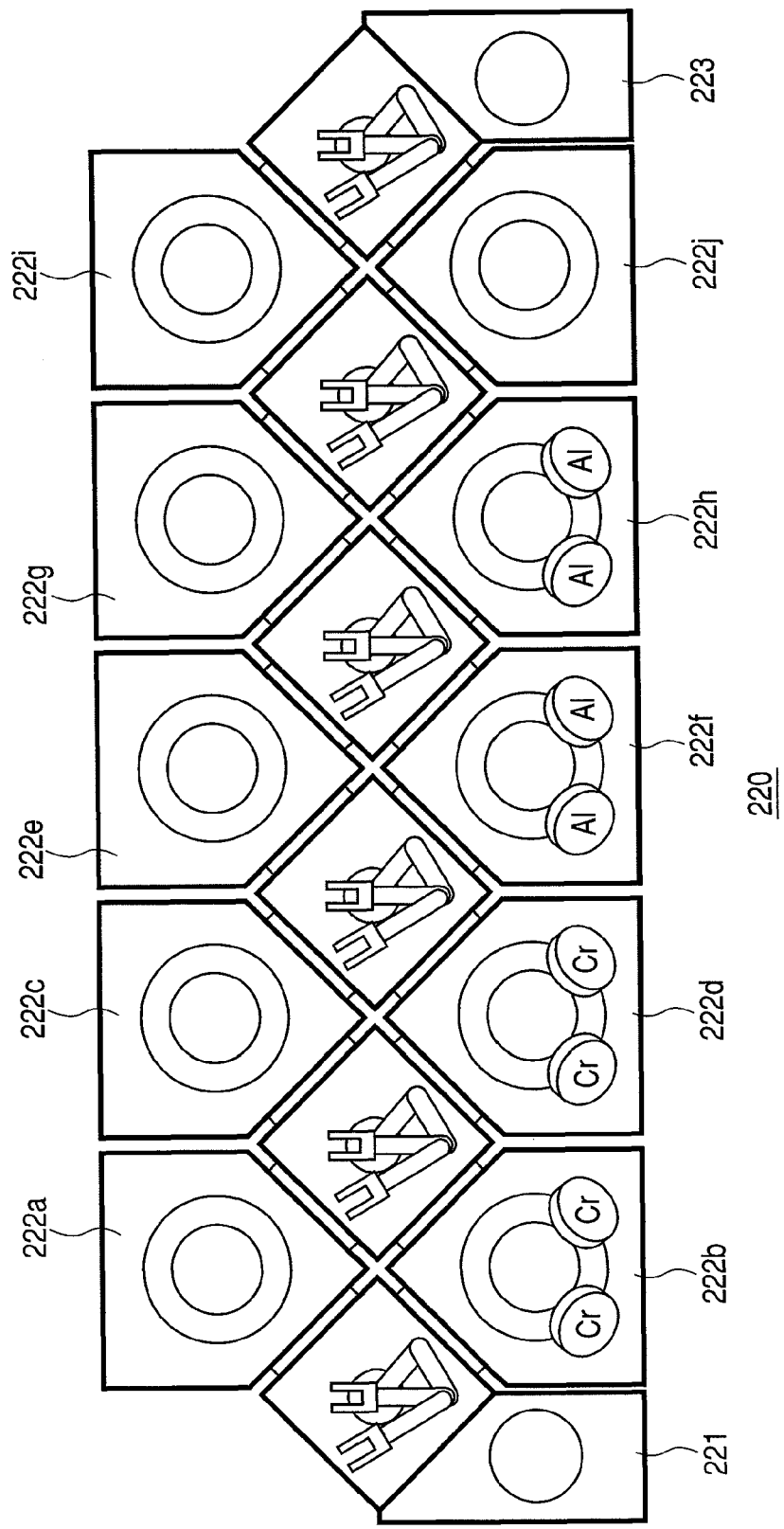
FIG. 22 is a diagram showing a case where an actual process is performed using an inline-type wafer conveyance device similar to that in FIG. 20.

FIG. 22 shows a case where an actual process is performed using an inline-type wafer conveyance device 220 similar to that in FIG. 20. A flow of procedure for forming a CrOx/AlOx laminated film, a CrOx single layer film, or an AlOx single layer film, which is an insulating film used in a semiconductor device, is supposed. After a Cr film is formed in a second process module 222b, a CrOx film is formed by an oxidation process in a third process module 222c. The formation of an AlOx film is the same, that is, after an Al film is formed in a sixth process module 222f, the AlOx film is formed by an oxidation process in a seventh process module 222g. In accordance with a required film thickness, a plurality of sets (not shown schematically) of Cr film formation modules (222b, 222d) and oxidation modules (222c, 222e) is prepared, and the CrOx film is formed without return conveyance. In accordance with a required film thickness, a plurality of sets (not shown schematically) of Al film formation modules (222f, 222h) and oxidation modules (222g, 222i) is prepared and the AlOx film is formed without return conveyance. After the formation of the desired CrOx/AlOx laminated film, the CrOx single layer film, or the AlOx single layer film is completed, annealing processing is performed in a tenth process module 222j. In FIG. 22, a first process module 222a is a degas module, the third process module 222c, the fifth process module 222e, the seventh process module 222g and the ninth process module 222i are each an oxidation module, and the tenth process module 222j is an annealing module.

Figure 23:
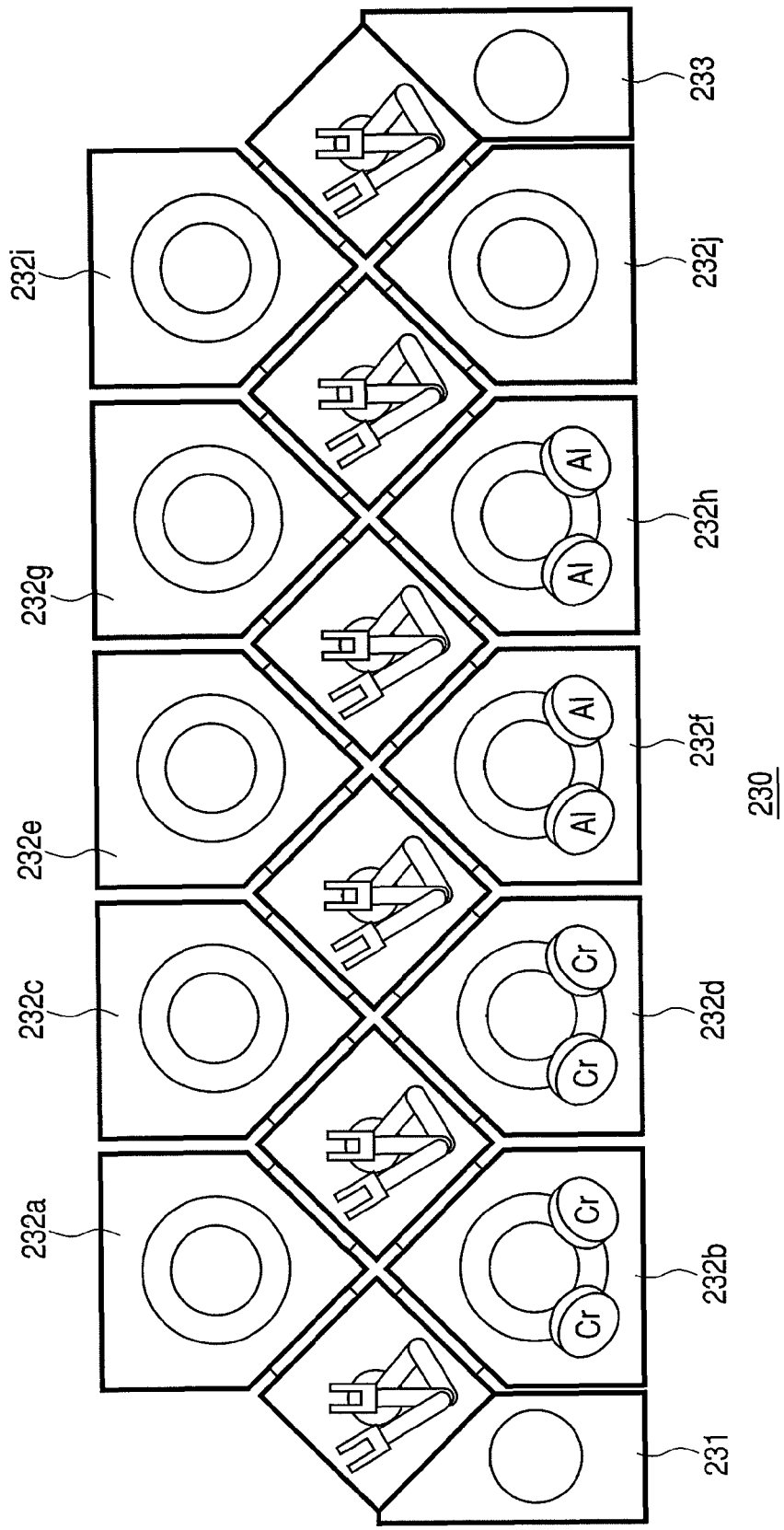
FIG. 23 is a diagram showing a case where an actual process is performed using an inline-type wafer conveyance device similar to that in FIG. 20.

FIG. 23 shows a case where an actual process is performed using an inline-type wafer conveyance device 230 similar to that in FIG. 20. A flow of procedure for forming a CrOx/AlOx laminated film, a CrOx single layer film, or an AlOx single layer film, which is an insulating film used in a semiconductor device, is supposed. After a Cr film is formed in a second process module 232b, a CrOx film is formed by an oxidation process in a third process module 232c. The formation of an AlOx film is the same, that is, after an Al film is formed in a sixth process module 232f, the AlOx film is formed by an oxidation process in a seventh process module 232g. In accordance with a required film thickness, a plurality of sets (not shown schematically) of Cr film formation modules (232b, 232d) and oxidation modules (232c, 232e) is prepared and film formation and oxidation are repeated with return conveyance. When the CrOx film having a thickness of 20 nm is formed, after the Cr film having a thickness of 1 nm is formed, the CrOx film having a thickness of 2 nm is formed in an oxidation module, and the CrOx film (20 nm) is formed by repeating the above-mentioned tasks ten times. The formation of the AlOx film is the same. After the formation of the desired CrOx/AlOx laminated film, the CrOx single layer film, or the AlOx single layer film is completed, annealing processing is performed in a tenth process module 232j. In FIG. 23 also, a first process module 232a is a degas module, the third process module 232c, the fifth process module 232e, the seventh process module 232g and a ninth process module 232i are each an oxidation module, and the tenth process module 232j is an annealing module.

Figure 24:
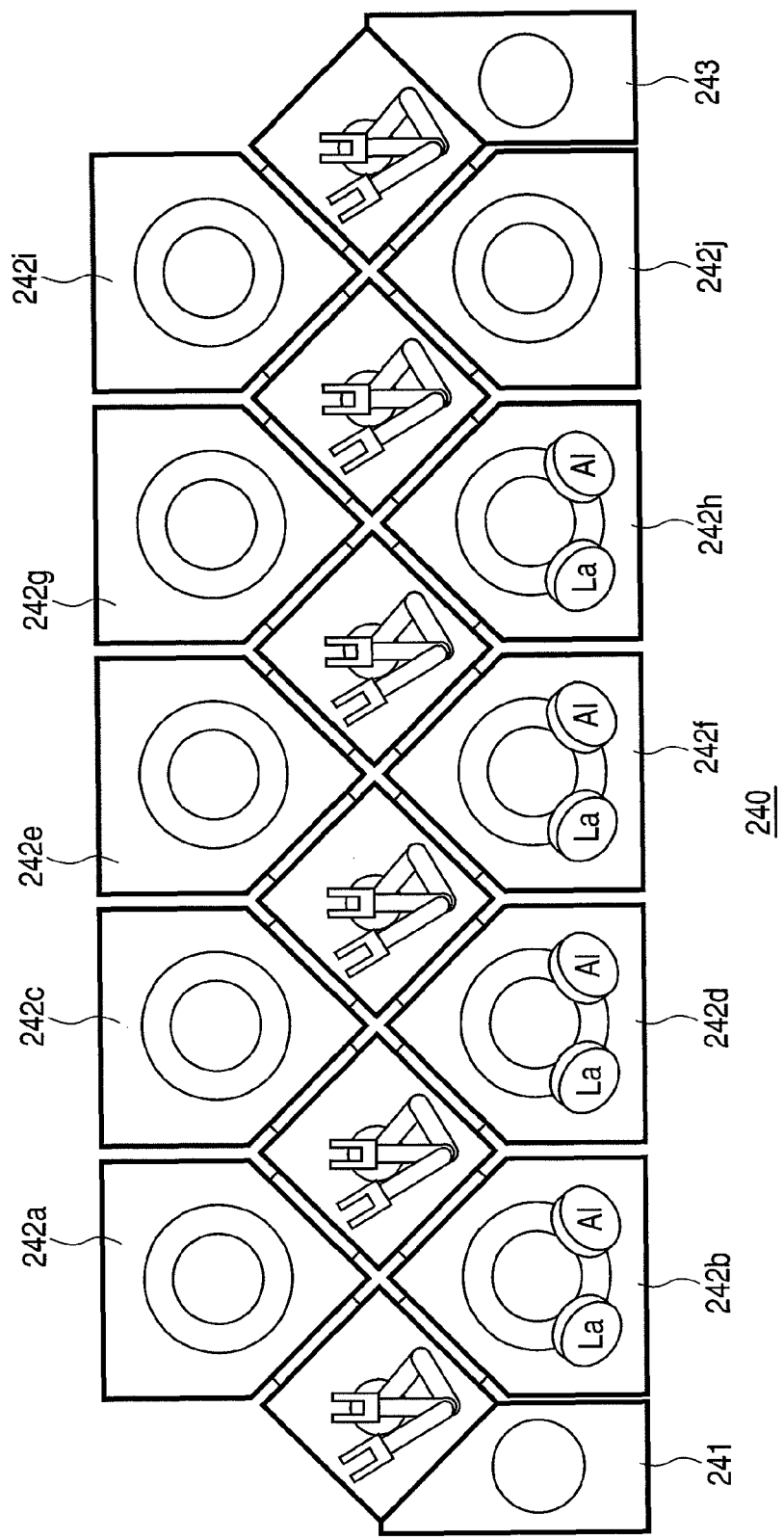
FIG. 24 is a diagram showing a case where an actual process is performed using an inline-type wafer conveyance device similar to that in FIG. 20.

FIG. 24 shows a case where an actual process is performed using an inline-type wafer conveyance device 240 similar to that in FIG. 20. A flow of procedure for forming a LaAlOx film, which is an insulating film used in a semiconductor device, is supposed. After a LaAl alloy film is formed by co-sputtering of La and Al in a second process module 242b, a LaAlOx film is formed by an oxidation process in a third process module 242c. Further, after a LaAl film is formed by co-sputtering of La and Al in a fourth process module 242d, the LaAlOx film is formed by an oxidation process in a fifth process module 242e. Similarly, film formation (sixth process module 242f), oxidation (seventh process module 242g), film formation (eighth process module 242h) and oxidation (ninth process module 242i) are repeated. The above-described set of processing is repeated in order to form a desired LaAlOx film.

In FIG. 24 also, a first process module 242a is a degas module, the third process module 242c, the fifth process module 242e, the seventh process module 242g and the ninth process module 242i are each an oxidation module, and a tenth process module 242j is an annealing module.

Figure 25:
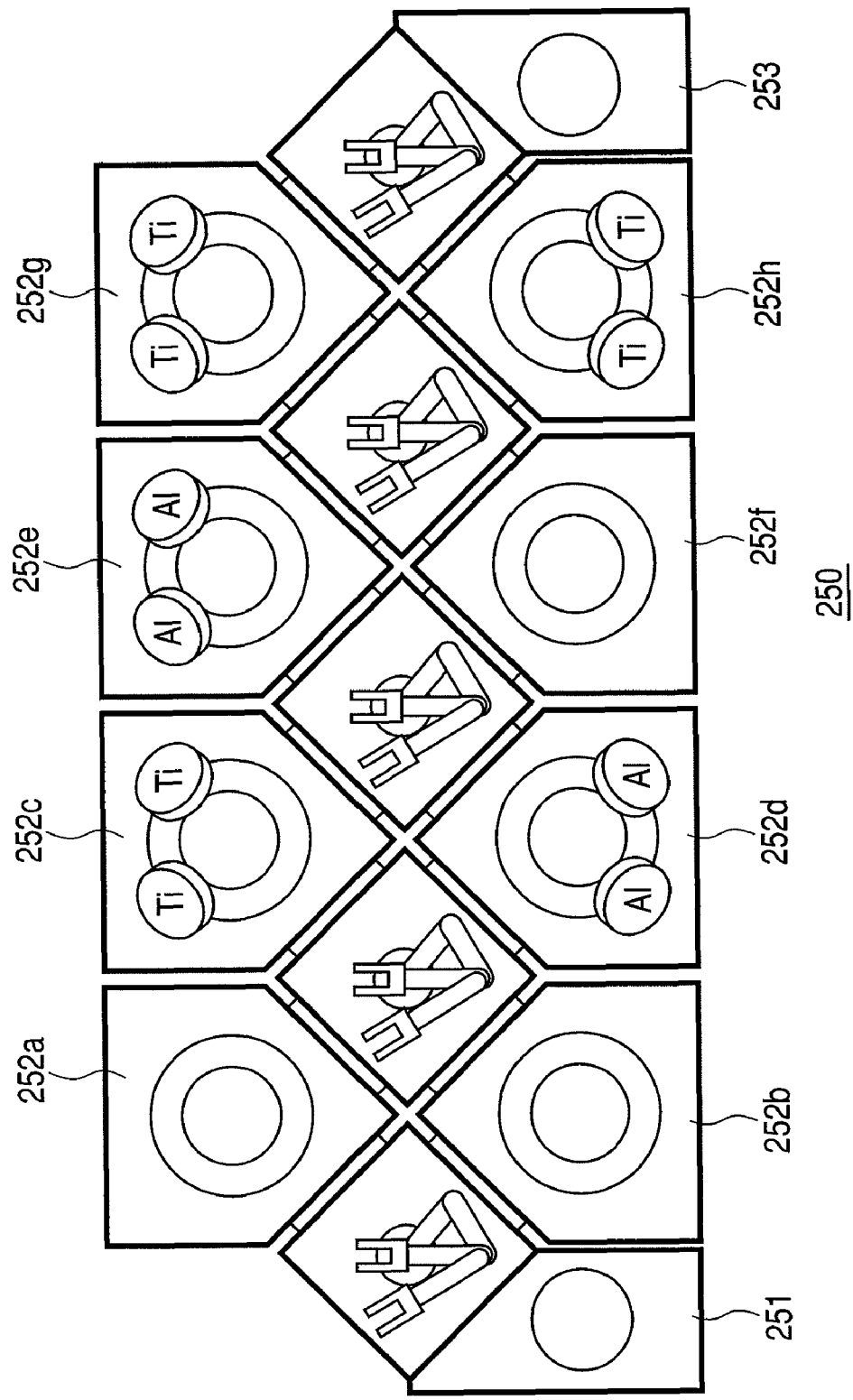
FIG. 25 is a diagram showing a case where an actual process is performed using an inline-type wafer conveyance device having a configuration similar to that shown in FIG. 14.

FIG. 25 shows a case where an actual process is performed using an inline-type wafer conveyance device 250 having the same structure as that shown in FIG. 14. A flow of procedure for forming a wiring Al film including via hole embedment used in a memory system device is supposed. The film structure is designed as, for example, Ti (20 nm)/TiN (60 nm)/Seed-Al (200 nm)/Fill-Al (450 nm)/TiN (100 nm). First, an unprocessed wafer is carried into a load chamber 251 from outside (atmosphere side) and the inside of the load chamber 251 is evacuated. Next, after the unprocessed wafer is carried into a first process module 252a, degassing processing is performed on the wafer and subsequently, pre-cleaning of the surface of the wafer is performed in a second process module 252b. Next, the wafer is carried into a third process module 252c and a titanium film (for example, 20 nm) and a TiN film (for example, 60 nm) are formed sequentially. Next, the wafer is carried into a fourth process module 252d from the fourth process module 252c and a Seed-Al film (for example, 200 nm) is formed. Next, the wafer is carried into a fifth process module 252e from the fourth process module 252d and a Fill-Al film (for example, 450 nm) is formed. Next, the wafer is carried into a sixth process module 252f from the fifth process module 252e and the wafer is cooled. After that, an ARC Cap film of TiN is formed in a seventh or eighth process module 252g or 252h, and the processed wafer is carried out from an unload chamber 253 to outside (atmosphere side).

In FIG. 25, the first process module 252a is a degas module, the second process module 252b is a pre-cleaning module, and the sixth process module 252f is a cooling module. In FIG. 25, the Ti film having a thickness of 20 nm is formed in 252c and the Seed-Al film having a thickness of 200 nm is formed in 252d, however, by preparing the two process modules 252c, it is also possible to form a Ti film having a thickness of 10 nm in the first process module and form a Ti film having a thickness of 10 nm in the second process module and then form a Ti film having a total thickness of 20 nm. For example, if the film formation in 252c requires two minutes and the film formation in 252d requires one minute, by preparing the two chambers 252c, it is possible to eliminate a wafer that waits for processing and thus the throughput can be improved as a result.

In the embodiments shown in FIGS. 17 to 25, each process module is shown schematically as a double arm structure, however, a single arm structure is also acceptable.

What is claimed is:
1. An inline-type wafer conveyance device comprising:
a load chamber for carrying in a wafer from outside;
an unload chamber for carrying out a wafer to outside; and
a plurality of conveyance chambers and a plurality of process module sets connected in series between the load chamber and the unload chamber, each of the process module sets having a first process module and a second process module capable of independent processing, wherein:
the conveyance chambers and the process module sets are provided alternately;
the plurality of conveyance chambers includes a first end conveyance chamber connected to the load chamber, a second end conveyance chamber connected to the unload chamber, and another one or a plurality of intermediate conveyance chambers;
the first end conveyance chamber conveys a wafer from the load chamber to an initial process module set, each of the intermediate conveyance chambers conveys the wafer between process module sets located ahead and behind thereof, and the second end conveyance chamber conveys the wafer from a last process module set to the unload chamber;
the first and second process modules and the conveyance chamber have substantially a square plane shape; and
the first process module and the second process module have two neighboring side surfaces, respectively, one of the side surfaces of the first process module is connected to one of the side surfaces of a conveyance chamber located ahead via a gate valve, the other side surface of the first process module is connected to one of the side surfaces of a conveyance chamber located behind via a gate valve, one of the side surfaces of the second process module is connected to the other side surface of the conveyance chamber located ahead via a gate valve, and the other side surface of the second process module is connected to the other side surface of the conveyance chamber located behind via a gate valve.

2. An inline-type wafer conveyance device comprising:
a load chamber for carrying in a wafer from outside;
an unload chamber for carrying out a wafer to outside; and a plurality of conveyance chambers and a plurality of process module sets connected in series between the load chamber and the unload chamber, each of the process module sets having a first process module and a second process module capable of independent processing, wherein:

the conveyance chambers and the process module sets are provided alternately;

the plurality of conveyance chambers includes a first end conveyance chamber connected to the load chamber, a second end conveyance chamber connected to the unload chamber, and another one or a plurality of intermediate conveyance chambers;

the first end conveyance chamber conveys a wafer from the load chamber to an initial process module set, each of the intermediate conveyance chambers conveys the wafer between process module sets located ahead and behind thereof, and the second end conveyance chamber conveys the wafer from a last process module set to the unload chamber;

the first and second process modules and the conveyance chamber have substantially a square plane shape;

the first process module and the second process module have two neighboring side surfaces, respectively, one of the side surfaces of the first process module is connected to one of side surfaces of a conveyance chamber located ahead via a gate valve, the other side surface of the first process module is connected to one of side surfaces of a conveyance chamber located behind via a gate valve, one of the side surfaces of the second process module is connected to the other side surface of the conveyance chamber located ahead via a gate valve, and the other side surface of the second process module is connected to the other side surface of the conveyance chamber located behind via a gate valve; and in at least one of the process module sets, a buffer chamber is located instead of at least one of the first process module and the second process module, and the buffer chamber is configured so as to be connected to the conveyance chambers located ahead and behind via two gate valves opposite of each other.

* * * * *